(12) United States Patent
Russell et al.

(10) Patent No.: US 11,764,146 B2
(45) Date of Patent: *Sep. 19, 2023

(54) MICROELECTRONIC DEVICES WITH SELF-ALIGNED INTERCONNECTS, AND RELATED METHODS

(71) Applicant: Micron Technology, Inc., Boise, ID (US)

(72) Inventors: Stephen W. Russell, Boise, ID (US); Fabio Pellizzer, Boise, ID (US); Lorenzo Fratin, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/379,257

(22) Filed: Jul. 19, 2021

(65) Prior Publication Data

US 2021/0351125 A1    Nov. 11, 2021

Related U.S. Application Data

(63) Continuation of application No. 16/653,442, filed on Oct. 15, 2019, now Pat. No. 11,069,610.

(51) Int. Cl.
| | |
|---|---|
| *H01L 21/00* | (2006.01) |
| *H01L 23/522* | (2006.01) |
| *H01L 21/768* | (2006.01) |

(52) U.S. Cl.
CPC .... *H01L 23/5226* (2013.01); *H01L 21/76846* (2013.01); *H01L 21/76871* (2013.01); *H01L 21/76877* (2013.01)

(58) Field of Classification Search
CPC ............. H01L 23/5226; H01L 23/5225; H01L 23/288; H01L 23/5283; H01L 23/528;
(Continued)

(56) References Cited

U.S. PATENT DOCUMENTS

| | | | |
|---|---|---|---|
| 6,090,699 A | 7/2000 | Aoyama et al. | |
| 6,424,041 B1 | 7/2002 | Oashi et al. | |

(Continued)

FOREIGN PATENT DOCUMENTS

| | | |
|---|---|---|
| JP | 1997-172067 A | 6/1997 |
| JP | 2019-062192 A | 4/2019 |

(Continued)

OTHER PUBLICATIONS

Taiwanese Office Action for Application No. 109133602, dated Jul. 8, 2021, 13 pages.

(Continued)

*Primary Examiner* — Nikolay K Yushin
(74) *Attorney, Agent, or Firm* — TraskBritt

(57) ABSTRACT

Methods for forming microelectronic device structures include forming interconnects that are self-aligned with both a lower conductive structure and an upper conductive structure. At least one lateral dimension of an interconnect is defined upon subtractively patterning the lower conductive structure along with a first sacrificial material. At least one other lateral dimension of the interconnect is defined by patterning a second sacrificial material or by an opening formed in a dielectric material through which the interconnect will extend. A portion of the first sacrificial material, exposed within the opening through the dielectric material, along with the second sacrificial material are removed and replaced with conductive material(s) to integrally form the interconnect and the upper conductive structure. The interconnect occupies a volume between vertically overlapping areas of the lower conductive structure and the upper conductive structure, where such overlapping areas coincide with the opening through the dielectric material.

20 Claims, 26 Drawing Sheets

(58) Field of Classification Search
CPC ......... H01L 21/76846; H01L 21/76871; H01L 21/76877
See application file for complete search history.

(56) References Cited

U.S. PATENT DOCUMENTS

| | | | |
|---|---|---|---|
| 6,503,827 B1 | 1/2003 | Bombardier et al. | |
| 6,645,852 B1 | 11/2003 | Taguchi et al. | |
| 6,787,875 B2 | 9/2004 | Brennan et al. | |
| 6,812,131 B1 | 11/2004 | Kennedy et al. | |
| 8,614,123 B2 | 12/2013 | Wei et al. | |
| 9,607,893 B1 | 3/2017 | Zhang et al. | |
| 10,050,084 B2 | 8/2018 | Lee et al. | |
| 10,354,912 B2* | 7/2019 | Xu | H01L 21/76832 |
| 10,395,986 B1 | 8/2019 | Briggs et al. | |
| 10,424,507 B2* | 9/2019 | Zhang | H01L 23/481 |
| 10,790,191 B2* | 9/2020 | Mullick | H01L 21/7681 |
| 2002/0030215 A1 | 3/2002 | Oashi et al. | |
| 2005/0124149 A1 | 6/2005 | Kim et al. | |
| 2008/0315330 A1 | 12/2008 | Walker et al. | |
| 2009/0263970 A1 | 10/2009 | Bai et al. | |
| 2016/0190008 A1* | 6/2016 | Chandrashekar | H01L 21/28556 438/627 |
| 2017/0250104 A1 | 8/2017 | Singh et al. | |
| 2017/0271202 A1* | 9/2017 | Xu | H01L 23/49894 |
| 2017/0330761 A1 | 11/2017 | Chawla et al. | |
| 2018/0286749 A1* | 10/2018 | Zhang | H01L 21/76801 |
| 2019/0348322 A1* | 11/2019 | Mullick | H01L 21/76807 |

FOREIGN PATENT DOCUMENTS

| | | |
|---|---|---|
| JP | 2019-153780 A | 9/2019 |
| KR | 10-2014-0090946 A | 7/2014 |
| KR | 10-2018-0052106 A | 5/2018 |
| WO | 2015/047318 A1 | 4/2015 |
| WO | 2018/064292 A1 | 4/2018 |
| WO | 2019/190463 A1 | 10/2019 |
| WO | 2019/190499 A1 | 10/2019 |

OTHER PUBLICATIONS

International Search Report for Application No. PCT/US2020/051445, dated Dec. 30, 2020, 3 pages.
Khan et al., "Damascene Process and Chemical Mechanical Planarization," http://classweb.ece.umd.edu/enee416/GroupActivities/Damascene%20Presentation.pdf, (2011), 25 pages.
Khan et al., "Damascene Process and Chemical Mechanical Planarization," https://pds.semanticscholar.org/234a/69f25af894ee-556fd194cb79bebd0fe8a07d.pdf, (Oct. 19, 2011), 4 pages.
Written Opinion of the International Searching Authority for Application No. PCT/US2020/051445, dated Dec. 30, 2020, 5 pages.
Japanese Notice of Reasons for Refusal for Japanese Application No. 2022-522574, dated Sep. 20, 2022, 6 pages with English translation.

* cited by examiner

MICROELECTRONIC DEVICES WITH SELF-ALIGNED INTERCONNECTS, AND RELATED METHODS

CROSS-REFERENCE TO RELATED APPLICATION

This application is a continuation of U.S. patent application Ser. No. 16/653,442, filed Oct. 15, 2019, now U.S. Pat. No. 11,069,610, issued Jul. 20, 2021, the disclosure of which is hereby incorporated herein in its entirety by this reference.

TECHNICAL FIELD

Embodiments of the disclosure relate to the field of microelectronic device design and fabrication. More particularly, the disclosure relates to methods for forming microelectronic devices (e.g., memory devices) with self-aligned interconnects between lower and upper conductive structures. The disclosure also relates to devices and to systems incorporating such self-aligned interconnects.

BACKGROUND

Integrated circuits (ICs), the key components in thousands of electronic systems, generally include interconnected networks of electrical components (e.g., semiconductor devices) fabricated on a common foundation, or substrate. The semiconductor devices may include capacitors, resistors, transistors, diodes, or other devices, and the devices may be arranged in varying levels supported by one substrate. Interconnect structures (referred to herein simply as "interconnects") are one means of electrically connecting the semiconductor devices of the varying levels. Interconnects generally include a region of electrically conductive material formed between semiconductor devices or other portions of the semiconductor devices that are being placed in electrical communication. The interconnects provide a conduit for delivering electrical current between the electrically connected devices or regions. Specific types of interconnects include vias, plugs, filled trenches, local interconnects, and buried contacts.

Sufficient electrical connection by interconnects generally depends on sufficient physical contact between the interconnect and the structures or regions between which the interconnect is providing electrical communication. In forming an interconnect between a lower level and an upper level of an IC, ensuring sufficient physical contact can be challenging. Fabricating multi-level structures is generally simplest if forming the materials of each level in sequence, from bottom to top. Thus, a first conductive structure may be formed at a lower level, an interconnect may be formed at an intermediate level on and in contact with the first conductive structure, and then a second conductive structure may be formed at an upper level on and in contact with the interconnect. Such fabrication methods, however, may present challenges in ensuring the interconnect does indeed physically contact the first and second conductive structures.

Interconnect fabrication challenges have also been influenced by the conductive materials of the interconnects, themselves. After all, interconnects not only need to have sufficient physical contact with the lower and upper conductive structures being electrically interconnected, but the material of the interconnects often have to meet sufficient performance characteristics, such as a low electrical resistivity. At one time, aluminum (Al) was a favored conductive material for interconnects fabricated according to conventional processes. That is, aluminum generally lent itself to fabrication processes in which a layer of the material could be patterned into desired interconnect structures. With the scaling of ICs to smaller and smaller dimensions, however, the lower electric resistivity of copper (Cu) made copper a more popular choice than aluminum (Al) for interconnects. However, copper (Cu) is generally difficult to pattern, so the same form-then-etch methods used for fabricating interconnects from Al were not generally conducive for fabricating interconnects from Cu. So-called "damascene" processes were developed by which the conductive material of the interconnects (e.g., Cu) could be formed, on a first conductive structure, by depositing the conductive material of the interconnect into, essentially a "mold," e.g., negative space defined by another material formed on the first conductive structure. Therefore, the other material would be formed on the lower level comprising the first conductive structure, and then the other material would be patterned by subtractive etching to define the negative space before the conductive material was formed in the negative space. Thereafter, the upper level comprising the second conductive structure would be formed on the interconnect.

"Dual damascene" fabrication processes were developed for forming interconnects from difficult-to-etch materials (e.g., Cu) with enhanced reliability of forming the interconnects with sufficient physical contact between lower and upper conductive structures. By dual damascene processes, the conductive material of the interconnect is formed (e.g., deposited) in conjunction with forming (e.g., depositing) the conductive material of the second conductive structure with which the interconnect is providing electrical communication. That is, dual layers of another material are formed over the lower level that comprises the first conductive structure, the dual layers of other material are etched in one or more stages to define a dual-layer negative space defining the structures for both the interconnect and the second conductive structure, and then the dual-layer negative space is filled with the conductive material for both the interconnect and the second conductive structure. By such dual damascene fabrication, the second conductive structure and the interconnect are "self-aligned," e.g., formed with ensured physical contact between the two structures. However, dual damascene fabrication processes generally do not ensure sufficient alignment (e.g., physical and electrical contact) between the interconnect and the first conductive structure. Accordingly, fabricating interconnects with reliable physical contact between the interconnects and associated lower and upper conductive structures remains a challenge.

BRIEF DESCRIPTION OF THE DRAWINGS

FIG. 14 is a cross-sectional, isometric, schematic illustration of a microelectronic device structure including self-aligned interconnects between conductive structures directed in intersecting directions.

FIG. 21 is a cross-sectional, isometric, schematic illustration of a microelectronic device structure including multiple levels of interconnects self-aligned with conductive structures that are directed in intersecting directions.

FIG. 25 is a cross-sectional, isometric, schematic illustration of a microelectronic device structure including an interconnect self-aligned with conductive structures that are directed in colinear directions.

DETAILED DESCRIPTION

Figure 1:
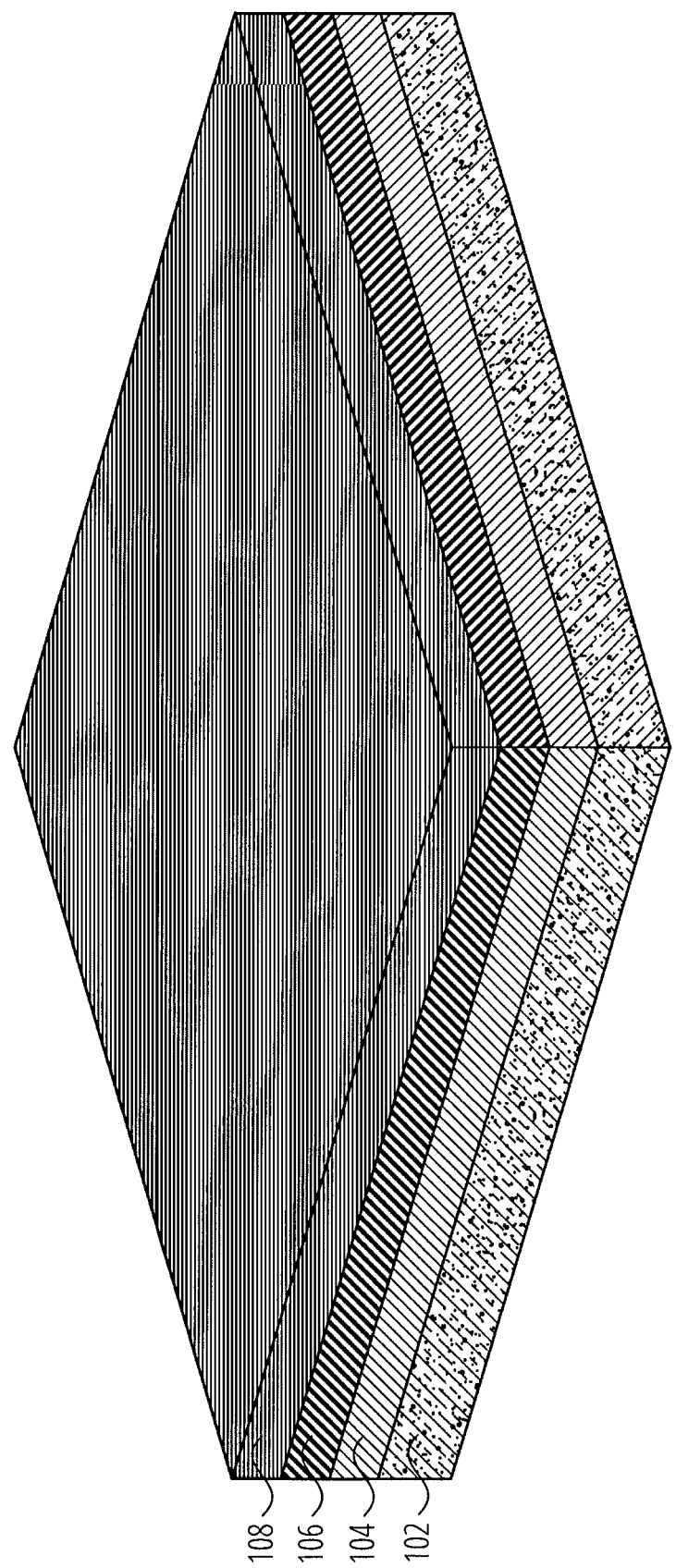
FIG. 1 through FIG. 14 are cross-sectional, isometric, schematic illustrations during various stages of processing to fabricate a microelectronic device structure including interconnects self-aligned with conductive structures directed in intersecting directions.

Methods for forming structures (e.g., microelectronic device structures) having interconnects, according to embodiments of the disclosure, ensure the interconnects are self-aligned with both a lower conductive structure and an upper conductive structure. The interconnect's first lateral dimension (e.g., width) and at least a portion of its height are defined while patterning the lower conductive structure along with a first sacrificial material. A blocking material is formed on the first sacrificial material, and an opening is formed in the blocking material, exposing the first sacrificial material where the interconnect is to be formed. A second sacrificial material is formed on the blocking material and in the opening. The second sacrificial material is patterned to define the upper conductive structure. The second sacrificial material and the portion of the first sacrificial material exposed within the opening are removed and replaced with conductive material to form the interconnect and the upper conductive structure. Therefore, the second lateral dimension (e.g., length) of the interconnect is defined either by a width of the upper conductive structure (e.g., in embodiments in which the lower conductive structure and the upper conductive structure are formed in intersecting directions) or by the length of the opening in the blocking material (e.g., in embodiments in which the lower conductive structure and the upper conductive structure are formed in colinear directions). The blocking material may also define the remainder of the height of the interconnect. The resulting interconnect is self-aligned with both the upper conductive structure and the lower conductive structure, enabling reliable physical contact and electrical connection by the interconnect.

As used herein, the term "intersecting directions," when referring to the directions of structures, means and includes the structures each defining a length (e.g., longest horizontal dimension) along a direction, such that the direction of at least one of the structures would intersect (e.g., not be wholly parallel to) the direction of at least another of the structures if such directions were drawn in the same plane. For example, "intersecting directions" include, but are not limited to, perpendicular directions, with at least one structure directed along an x-axis and at least one other structure directed along a y-axis, though the structures may be in different levels within a device structure.

As used herein, the term "colinear directions," when referring to the directions of structures, means and includes the structures each defining a length (e.g., longest horizontal dimension) along a direction, such that the direction of each of the structures would wholly overlap (e.g., not divert from one another, not intersect one another, and not be wholly parallel to one another) if such directions were drawn in the same plane. For example, "colinear directions" include, but are not limited to, one structure, in one level of a device structure, directed along an x-axis and at least one other structure, in at least one other level of the device structure, also directed along the x-axis.

As used herein, the term "opening" means a volume extending through at least one structure or at least one material, leaving a gap in that at least one structure or at least one material, or a volume extending between structures or materials, leaving a gap between the structures or materials. Unless otherwise described, an "opening" is not necessarily empty of material. That is, an "opening" is not necessarily void space. An "opening" formed in or between structures or materials may comprise structure(s) or material(s) other than that in or between which the opening is formed. And, structure(s) or material(s) "exposed" within an opening is(are) not necessarily in contact with an atmosphere or non-solid environment. Structure(s) or material(s) "exposed" within an opening may be adjacent or in contact with other structure(s) or material(s) that is(are) disposed within the opening.

As used herein, the term "sacrificial material" means and includes a material that is formed and/or employed during a fabrication process but which is subsequently removed, in whole or in part, prior to completion of the fabrication process. A "partially-sacrificial" material means and includes a sacrificial material from which only one or more portions is or are removed prior to completion of the fabrication process. A "wholly-sacrificial" material means and includes a sacrificial material that is substantially entirely removed prior to completion of the fabrication process.

As used herein, the term "substrate" means and includes a base material or other construction upon which components, such as those within microelectronic devices, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, structures, or junctions in the base semiconductor structure or foundation.

As used herein, the terms "horizontal" or "lateral" mean and include a direction that is parallel to a primary surface of the substrate on which the referenced material or structure is located. The width and length of a respective material or structure may be defined as dimensions in a horizontal plane.

As used herein, the terms "vertical" or "longitudinal" mean and include a direction that is perpendicular to a primary surface of the substrate on which a referenced material or structure is located. The height of a respective material or structure may be defined as a dimension in a vertical plane.

As used herein, the terms "thickness," "thinness," or "height" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one element's or feature's relationship to another element(s) or feature(s) as illustrated in the figures, using—as a reference point—the primary surface of the substrate on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprises," "comprising," "includes," and/or "including" specify the presence of stated features, structures, stages, operations, elements, materials, components, and/or groups, but do not preclude the presence or addition of one or more other features, structures, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, chemical mechanical polishing ("CMP"), or other known methods.

Reference will now be made to the drawings, where like numerals refer to like components throughout. The drawings are not necessarily drawn to scale.

FIG. 1 through FIG. 14 illustrate various stages of a method for forming a microelectronic device structure that includes interconnects self-aligned with conductive structures directed in intersecting directions. A stack of materials may be formed with a substrate 102 on which may be formed (e.g., deposited), in sequence, a first conductive material 104, a first sacrificial material 106, and a hardmask 108.

The first conductive material 104 may be an electrically conductive material that may be patterned subtractively (e.g., formed initially as monolithic structure before select portions of the material are removed). The first conductive material 104 may include or consist of tungsten (W), aluminum (Al), or other subtractively patternable conductive material. In some embodiments, the first conductive material 104 may be free of copper (Cu). In other embodiments, the first conductive material 104 may include or consist of copper.

In some embodiments, the first sacrificial material 106 may include or consist of one or more of a dielectric material (e.g., silicon oxide, silicon nitride, silicon oxynitride, silicon oxycarbide, silicon carbide, silicon carbonitride, silicon oxycarbonitride), another silicon material (e.g., polysilicon (polycrystalline silicon), amorphous silicon), carbon, and/or a metal nitride. The first sacrificial material 106 may be a partially-sacrificial material.

In some embodiments, the first sacrificial material 106 may be formed to a thickness (e.g., height) about equal to a desired height for the interconnect to be formed. The height may be tailored according to design parasitic requirements, such as a great enough height so that there is sufficient space between a first conductive structure and a second conductive structure to avoid capacitance problems but of a short enough height to achieve a low electrical resistance in the interconnect. For example, the height of the first sacrificial material 106 may be in the range of from about 250 Angstroms (about 25 nm) to about 1000 Angstroms (about 100 nm), though shorter or taller heights are contemplated.

The hardmask 108 may include or consist of a dielectric material (e.g., silicon oxide, silicon nitride, silicon oxynitride, silicon oxycarbide, silicon carbide, silicon carbonitride, silicon oxycarbonitride), a metal, a metal oxide (e.g., aluminum oxide, titanium oxide), a metal nitride, or a combination thereof. The hardmask 108 may be selected to have a different composition than the first sacrificial material 106. That is, the compositions for the first sacrificial material 106 and the hardmask 108 may be selected so that the hardmask 108 can be subsequently removed selectively, without substantially removing the first sacrificial material 106.

Figure 2:
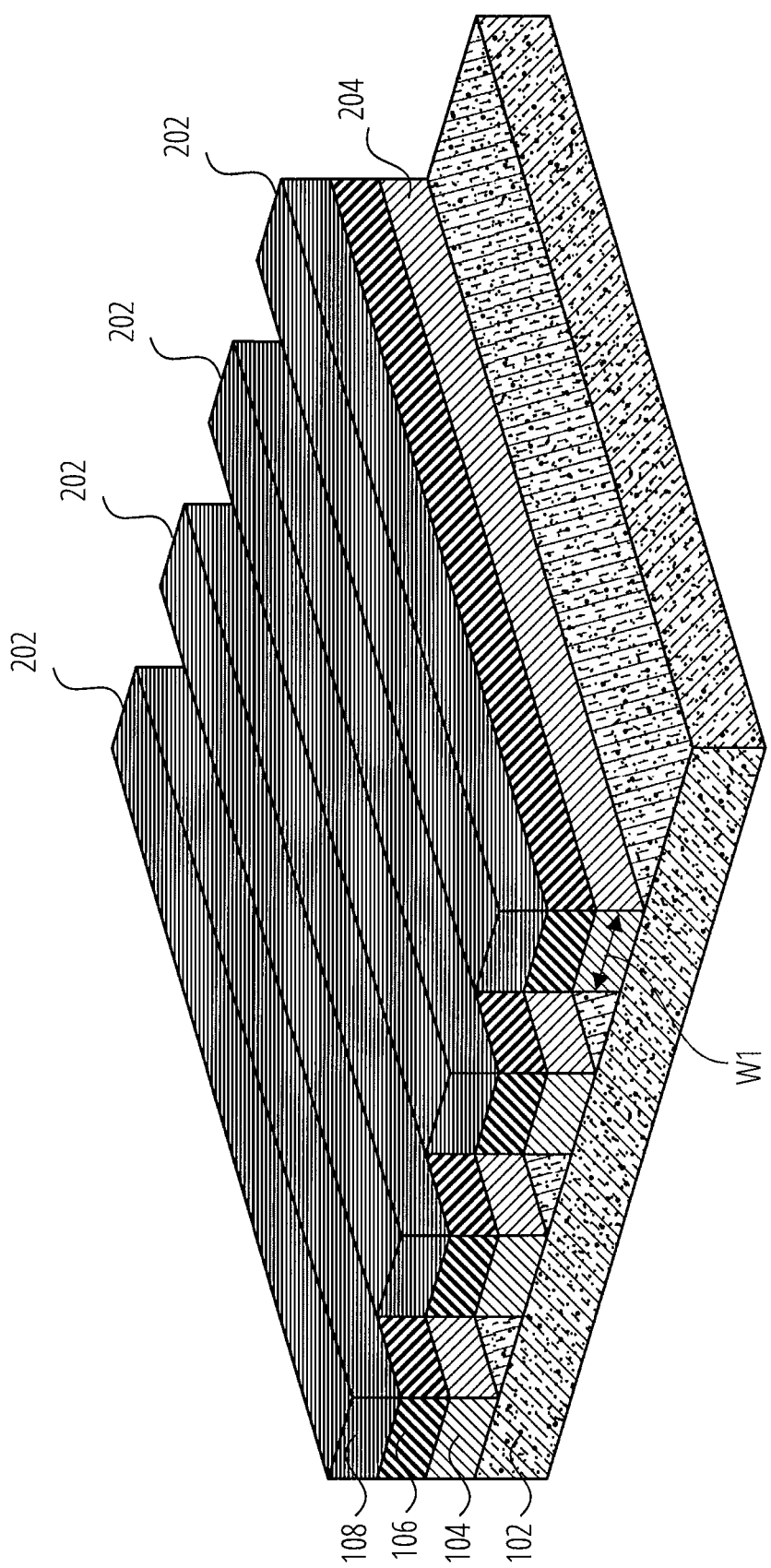

With reference to FIG. 2, the first conductive material 104, the first sacrificial material 106, and the hardmask 108 may then be subtractively patterned. The subtractive patterning may employ at least one material-removal process, which may include photolithographic patterning and etching acts. In some such embodiments, the subtractive patterning effectuates pitch multiplication (e.g., single pitch multiplication, double pitch multiplication, greater than double pitch multiplication). In other embodiments, the materials may be ion milled or (e.g., if the first conductive material 104 comprises or consists of copper (Cu)) patterned by high-temperature subtractive etching.

The patterning may form elongate features 202 that include first conductive structures 204, each of which may define a width W1. The first sacrificial material 106 of each of the elongate features 202 also has the width W1.

The number and relative disposition and spacing of the elongate features 202 may be tailored according to design needs. In some embodiments, discrete features may be formed instead of elongate features.

Figure 3:
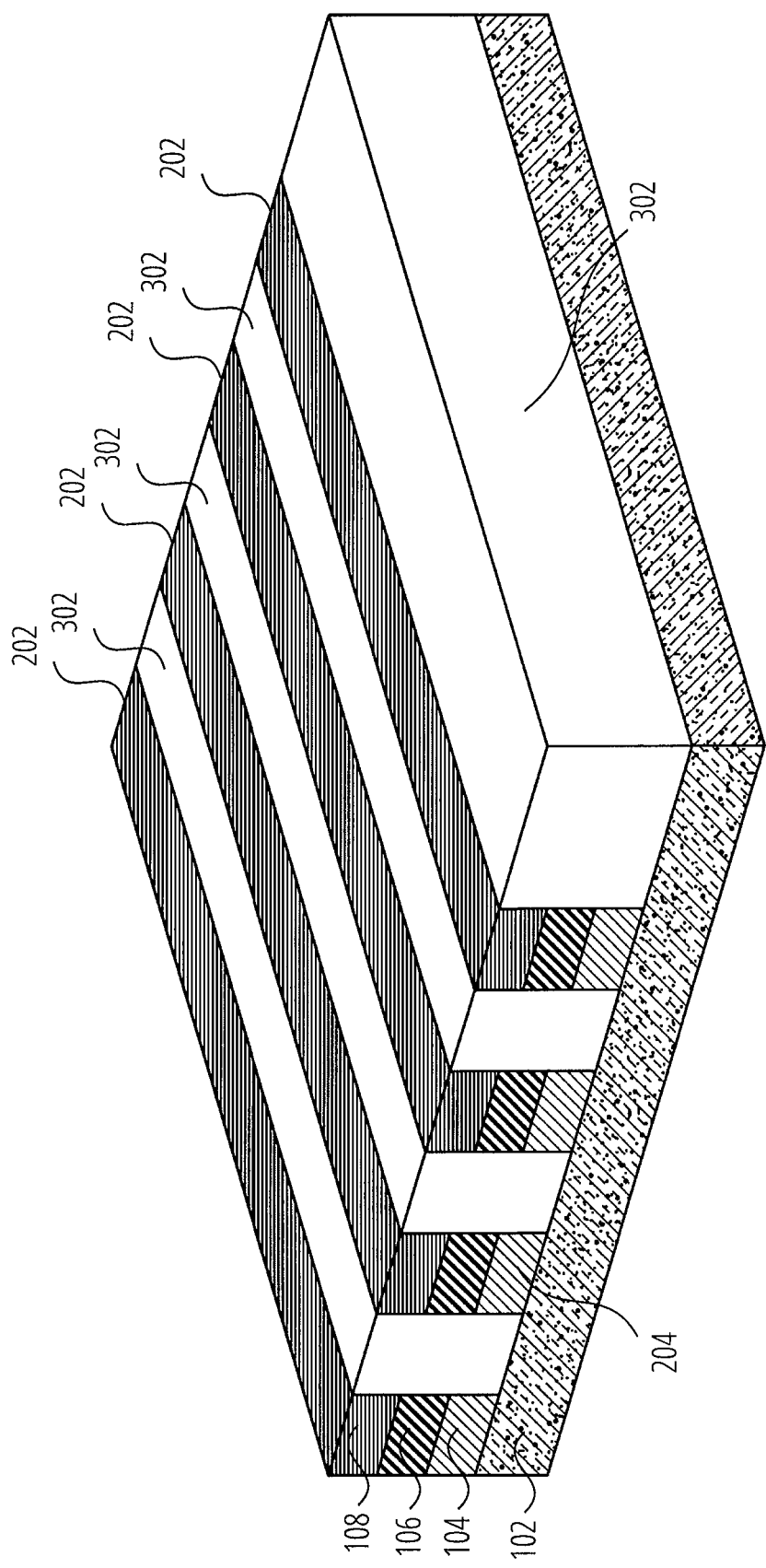

Openings (e.g., trenches) formed from the patterning of FIG. 2 may then be filled, as illustrated in FIG. 3, with a fill material(s) 302 that is electrically insulating. The fill material(s) 302 may comprise or consist of material(s) selected from dielectric material (e.g., silicon oxide, silicon nitride, silicon oxynitride, silicon oxycarbide, silicon carbide, silicon carbonitride, silicon oxycarbonitride), and polymeric material (e.g., a hydrocarbon-based material, a silicon-carbon-oxygen-hydrogen-containing material, a hydrogen methyl material, hydrogen silsesquioxane, methyl silsesquioxane). The fill material(s) 302 may be selected to have a different chemical composition from the first sacrificial material 106 so that, subsequently, the first sacrificial material 106 may be removed selectively, without substantially removing the fill material(s) 302.

The fill material(s) 302 may be formed by, for example, deposition (e.g., ALD; CVD, such as plasma-enhanced chemical vapor deposition (PE-CVD); combinations thereof). In some embodiments, the fill material(s) 302 are formed using a single (e.g., only one) deposition of material. In other embodiments, the fill material(s) 302 are formed using multiple (e.g., more than one) depositions of material or multiple depositions of different materials.

The fill material(s) 302 may be planarized (e.g., by CMP) to provide an upper surface of the fill material(s) 302 that is coplanar with an upper surface of the hardmask 108, as illustrated in FIG. 3. Therefore, the fill material(s) 302 may be formed to initially overfill the openings (e.g., trenches) between the elongate features 202 of FIG. 2. In embodiments in which the fill material(s) 302 are formed using a single (e.g., only one) deposition of material, the fill material(s) 302 may be planarized also using a single (e.g., only one) planarization act. In embodiments in which the fill material(s) 302 are formed using multiple (e.g., more than one) depositions of material or multiple depositions of different materials, one or more planarization acts may be used to planarize the fill material(s) 302 to provide the structure of FIG. 3.

Figure 4:
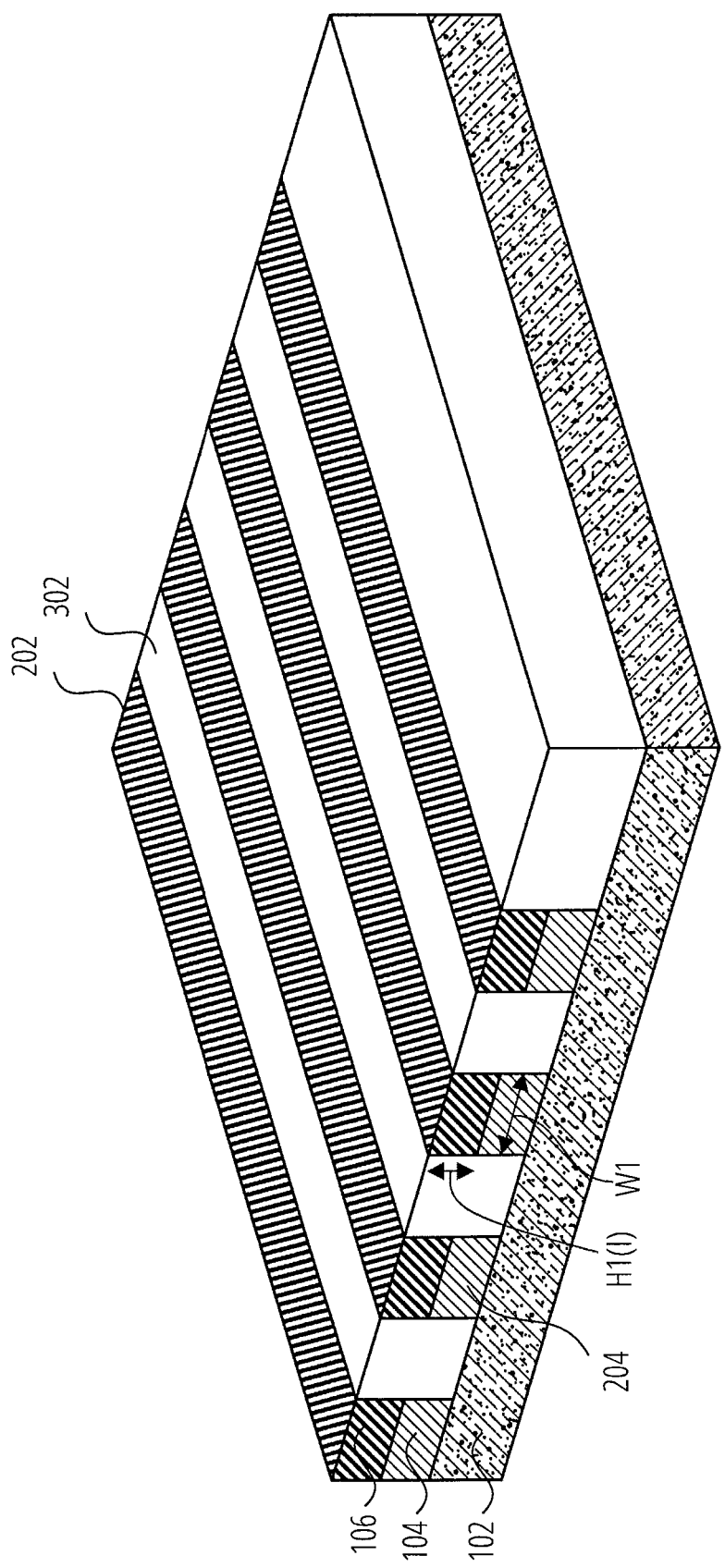

The hardmask 108 may then be removed, as illustrated in FIG. 4, to expose the first sacrificial material 106. The hardmask 108 may be removed (e.g., by planarization, such as CMP). Some of the first sacrificial material 106 may be removed along with the hardmask 108. However, whether none or some of the first sacrificial material 106 is removed with the hardmask 108, a sufficient amount of the first sacrificial material 106 remains to define a first height portion H1(I) for the interconnect. In some embodiments, the first height portion H1(I) may be a majority of the final height for the interconnect. The remaining first sacrificial material 106 may have an upper surface that is coplanar with an upper surface of the remaining fill material(s) 302.

Figure 5:
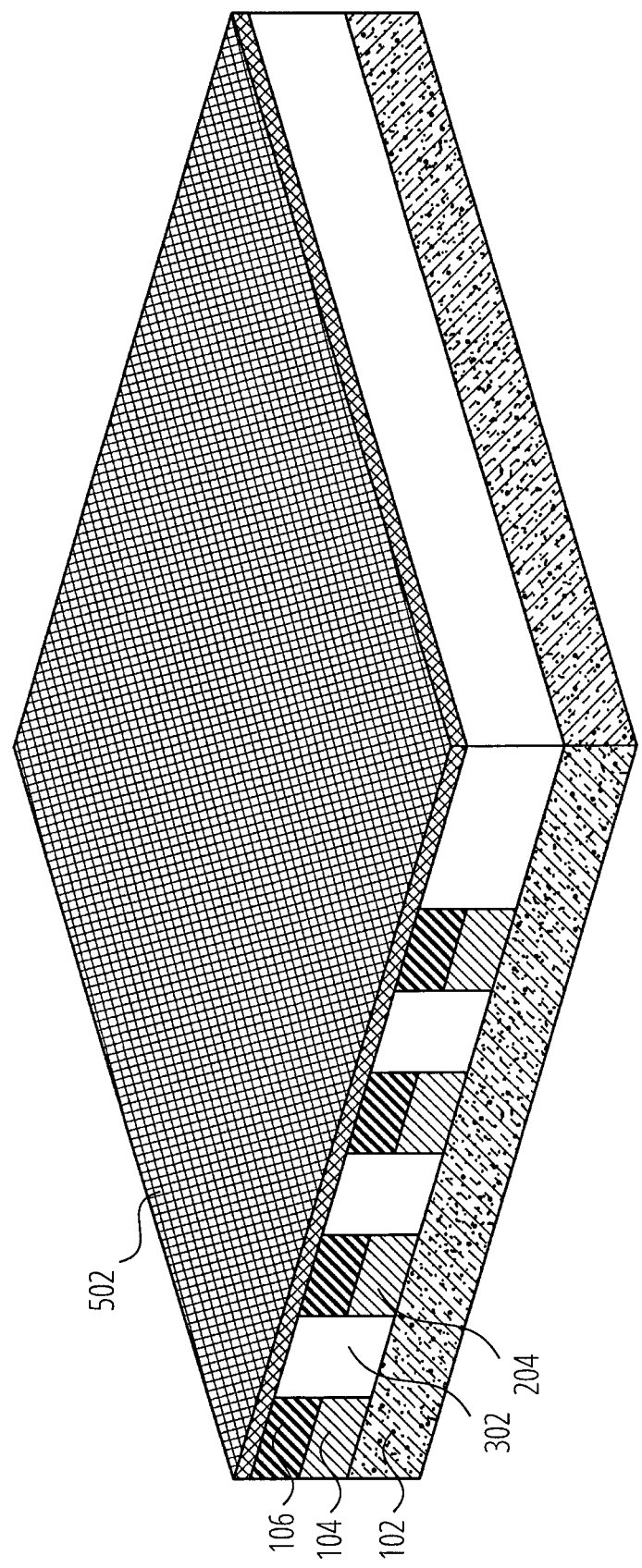

With reference to FIG. 5, a blocking material 502 is then formed (e.g., deposited) on (e.g., directly on) the first sacrificial material 106 and the fill material(s) 302. The blocking material 502 comprises or consists of a dielectric material of a composition tailored to permit the blocking material 502 to be subsequently removed without substantially removing either the first sacrificial material 106 or the fill material(s) 302. For example, the blocking material 502 may comprise or consist of a carbide (e.g., a silicon carbide) and/or amorphous carbon.

Figure 6:
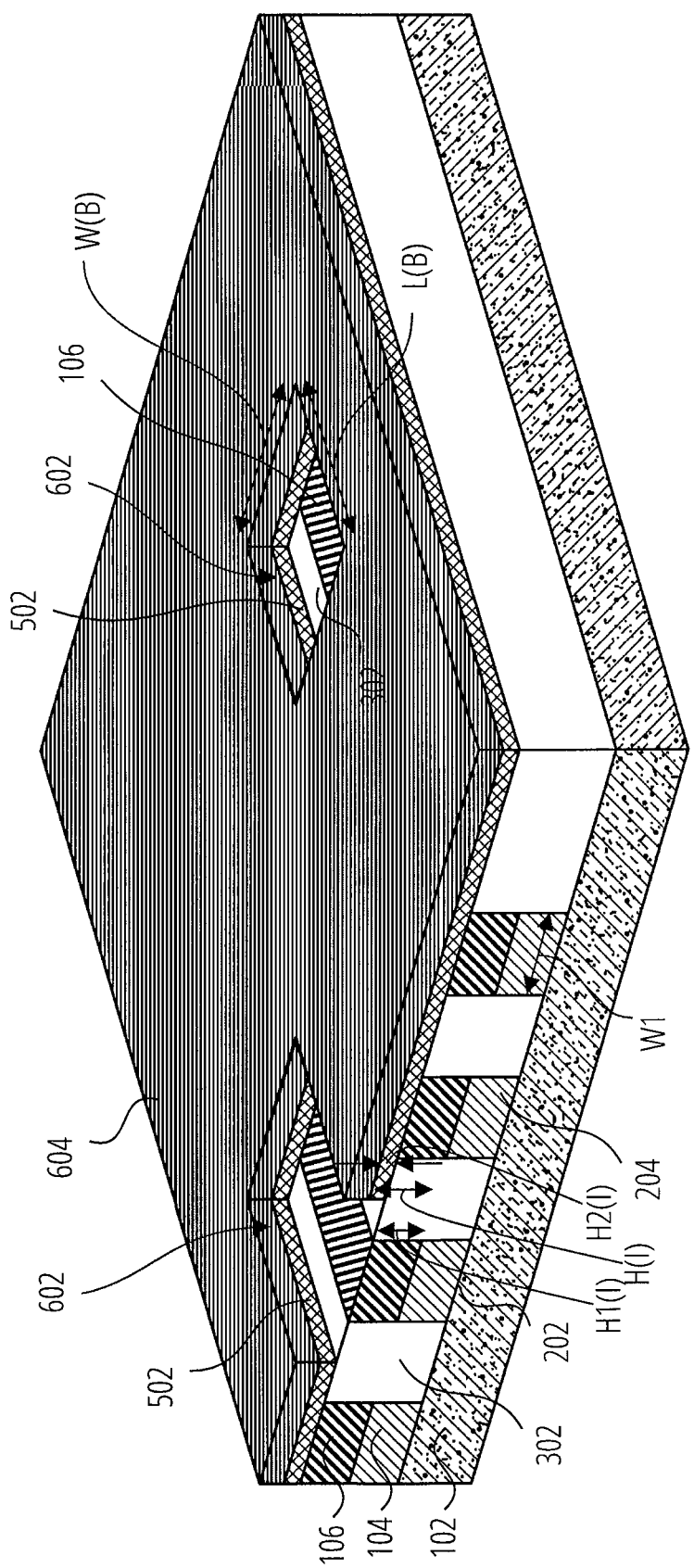

The blocking material 502 may be formed to wholly cover the upper surface of the structure of FIG. 4. Then, as illustrated in FIG. 6, one or more openings 602 are formed through the blocking material 502, exposing a portion of the first sacrificial material 106 where interconnects are to be formed. The openings 602 may be formed by forming a mask 604 on the blocking material 502 and using photolithography to selectively remove portions of the blocking material 502 in the area where the interconnects are to be formed. The mask 604 may comprise a photoresist material alone. In other embodiments, the mask 604 may be a multilayer hardmask comprising, e.g., a carbon material, a dielectric antireflective coating (DARC) material, and a photoresist material.

The openings 602 may be discrete openings. As used herein, the term "discrete opening" means and includes an opening the horizontal periphery of which is wholly defined by another material, e.g., one other material. The openings 602 may be discrete openings the horizontal periphery of which is wholly defined by the blocking material 502. It should be recognized that, where the openings 602 are illustrated in the drawings without a wholly-surrounding periphery defined by the blocking material 502, these illustrations are cut-away, cross-sectional illustrates in which portions of the structures that include the openings 602 are not illustrated for visibility of materials and structures that may otherwise not be readily visible in the illustrations.

The thickness H2(I) to which the blocking material 502 was formed may, in conjunction with the height H1(I) of the first sacrificial material 106, define the total height H(I) of the interconnects to be formed. In some embodiments, the thickness H2(I) of the blocking material 502 may be minimal, such that the height H1(I) of the first sacrificial material 106 substantially defines the height of the interconnects to be formed. In other embodiments, the blocking material 502 may be formed to a substantial height, making thickness H2(I) a substantial portion of the total height H(I) of the interconnects. Therefore, the thicknesses of the first sacrificial material 106 (e.g., height H1(I)) and of the blocking material 502 (e.g., thickness H2(I)) may be tailored to achieve a desired height for the interconnects.

The openings 602 may be formed with one or more lateral dimensions (e.g., width W(B) and length L(B)) greater than the corresponding one or more lateral dimensions of the interconnects to be formed. For example, the openings 602 may be formed with width W(B) that is greater than width W1, the width of both the first conductive structures 204 and at least lower portions of interconnects to be formed. In some embodiments, the openings 602 may expose some of the fill material(s) 302 alongside the exposed portions of the first sacrificial material 106. Therefore, the openings 602 need not necessarily be formed with exact precision, yet the resulting interconnects may have precise alignment with respective first conductive structures 204.

Though only two openings 602 are illustrated in FIG. 6, only one of the openings 602 may be formed (e.g., if only one interconnect is to be formed), or more than two of the openings 602 may be formed, with the number of openings 602 equaling the number of interconnects to be formed. In some embodiments, one or more of the openings 602 may overlap more than one of the first conductive structures 204, such that the interconnects to be formed electrically connect with more than one of the first conductive structures 204. Therefore, the size and disposition of the openings 602 may be tailored according to the desired electrical connections to be provided by the interconnects being fabricated.

Figure 7:
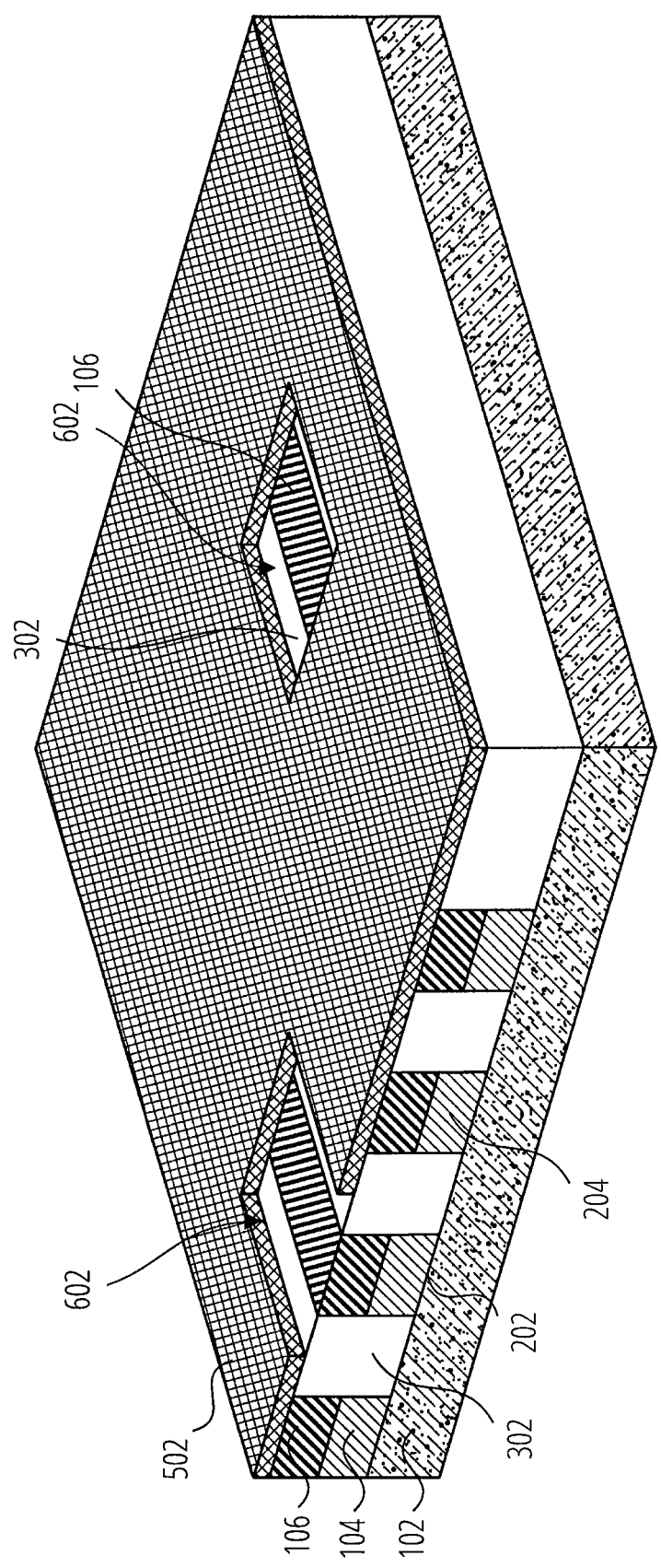

The mask 604 may be wholly removed (e.g., stripped), leaving a structure as illustrated in FIG. 7, with the openings 602 through select regions of the blocking material 502, exposing select portions of the first sacrificial material 106 through the openings 602. Therefore, as discussed above, the composition of the mask 604 (FIG. 6) may be selected or otherwise tailored to enable removing the mask 604 selective to the first sacrificial material 106 and the fill material(s) 302.

Figure 8:
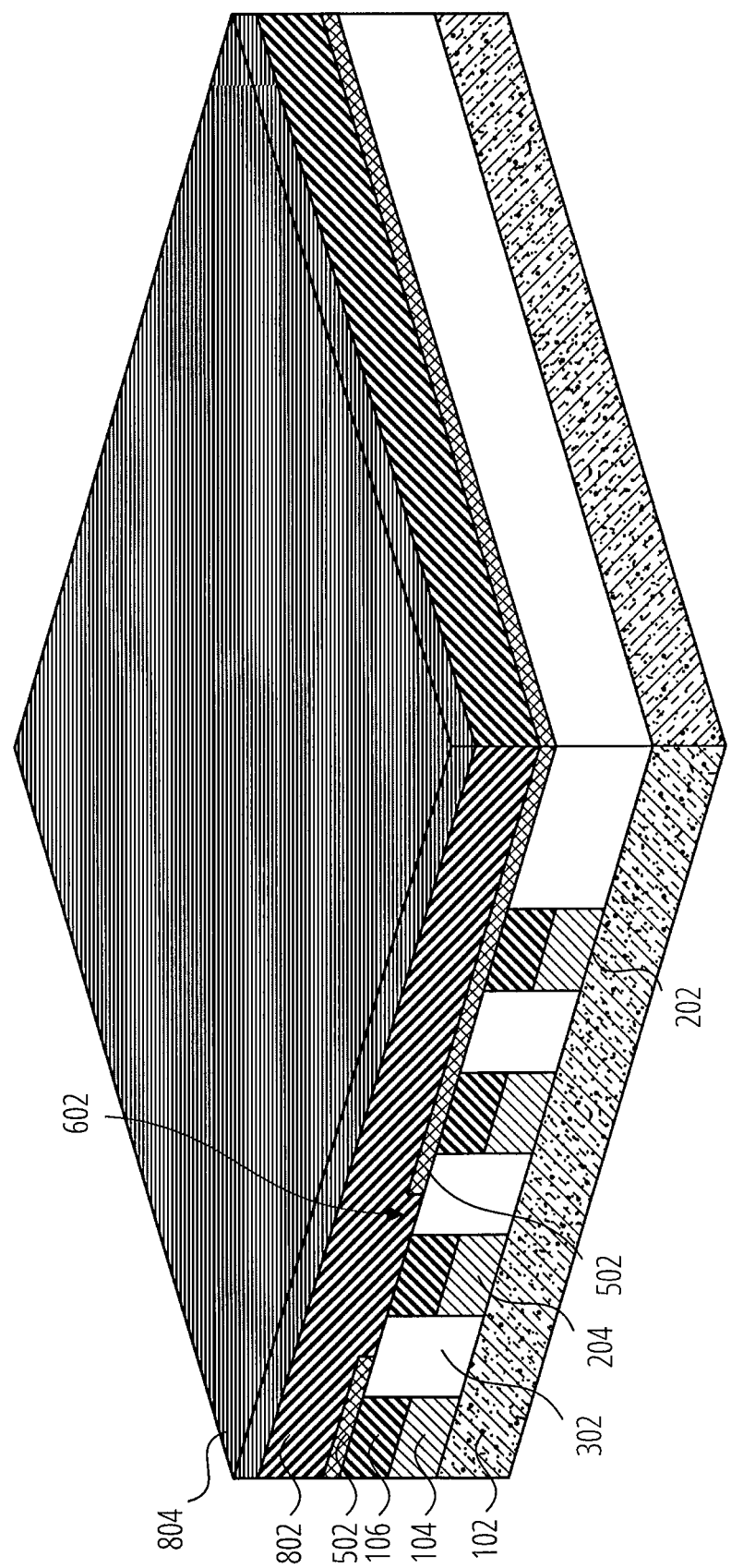

With reference to FIG. 8, a second sacrificial material 802 and another hardmask 804 are then formed (e.g., deposited in succession) over the blocking material 502, filling and covering the openings 602. The second sacrificial material 802 may be in direct physical contact with the first sacrificial material 106 portions that were exposed by the openings 602. An upper surface of the second sacrificial material 802 may be planarized before forming the other hardmask 804.

The second sacrificial material 802 may be selected from the same materials from which the first sacrificial material

106 may be selected; however, the second sacrificial material 802 may be selected to be a different one of the materials than that selected for the first sacrificial material 106 with the selections made enabling the second sacrificial material 802 to be removed without removing the first sacrificial material 106. For example, if the first sacrificial material 106 is formed of polysilicon, the second sacrificial material 802 may be formed of silicon oxide.

While the first sacrificial material 106 may be a partially-sacrificial material, such that portions of the first sacrificial material 106 may remain in the final structure, the second sacrificial material 802 may be a wholly-sacrificial material with no portion thereof (or substantially no portion thereof) remaining in the final structure.

The other hardmask 804 may be selected from the same materials discussed above for the hardmask 108 (FIG. 1).

Figure 9:
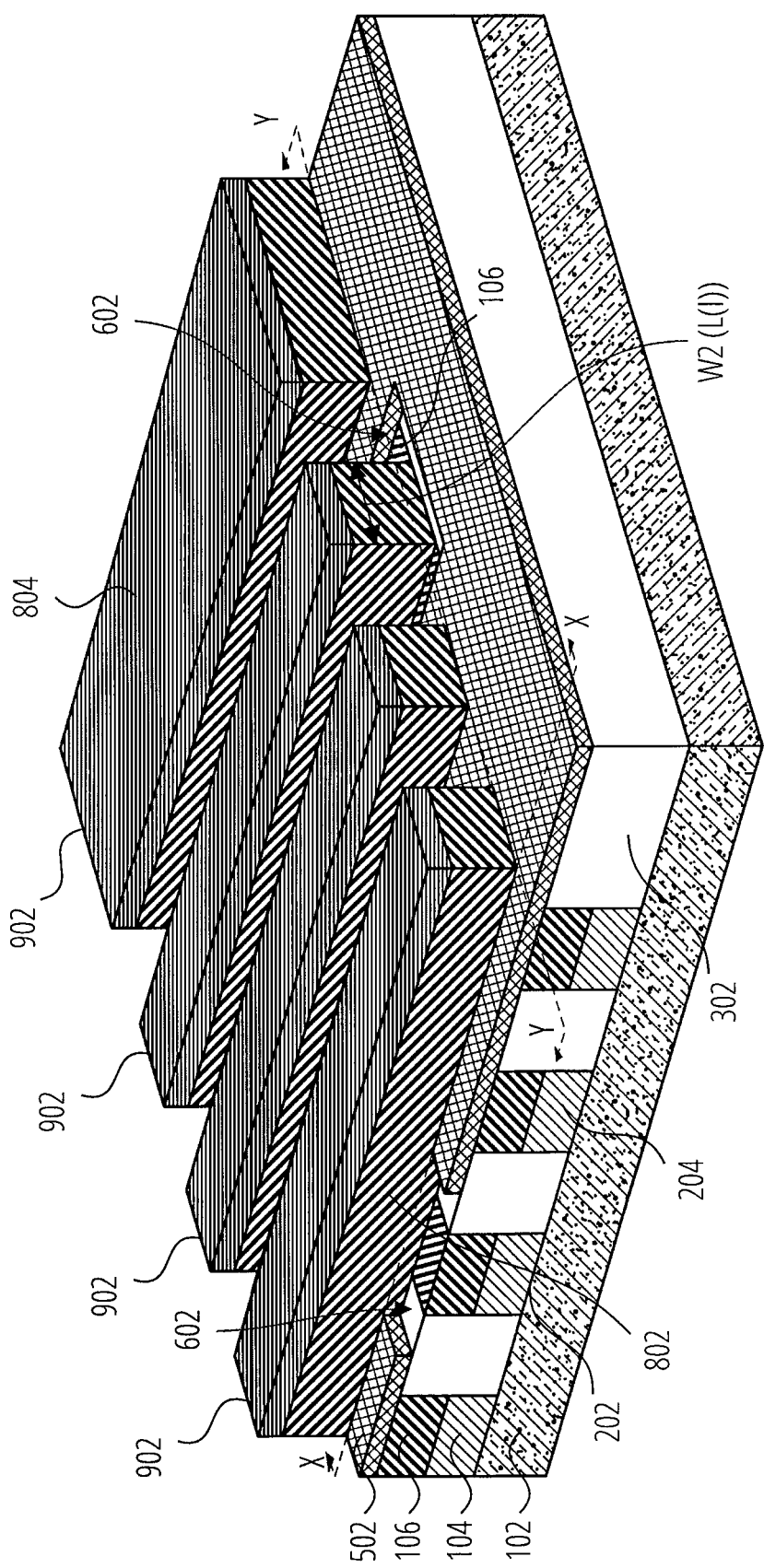

The second sacrificial material 802 and the other hardmask 804 are then patterned (e.g., by anisotropic etching using the other hardmask 804), as illustrated in FIG. 9, to define elongate structures 902, with at least one of the elongate structures 902 corresponding to each of the openings 602 and having width W2, which will define and therefore equal the width of the upper second conductive structures to be formed. The lateral dimension (e.g., width) of the second sacrificial material 802 that is in physical contact with the first sacrificial material 106 exposed within the openings 602 will define, and therefore equal, a length L(I) of the interconnects to be formed. Therefore, if the elongate structures 902 are formed so that the whole width W2 of the second sacrificial material 802 is within lateral width of a respective one of the openings 602, then the length L(I) of the interconnects to be formed will equal the width W2 of the second sacrificial material 802 after patterning. Nonetheless, even if the pattern for the elongate structures 902 is somewhat out of ideal alignment, the breadth of the openings 602 provides a processing margin for achieving sufficient physical contact between the second sacrificial material 802 and the first sacrificial material 106 (and, therefore, subsequent sufficient physical contact between the upper conductive structures and the interconnects to be formed), which processing margin is greater than the length L(I) of the interconnects to be formed.

The actual length and width of the elongate structures 902 may be tailored to meet design needs. Thus, while FIG. 9 illustrates the elongate structures 902 as terminating, lengthwise, along line Y-Y, in other embodiments, the length of the elongate structures 902 may continue until they terminate coplanar with the fill material(s) 302, the blocking material 502, or other underlying material.

Figure 10:
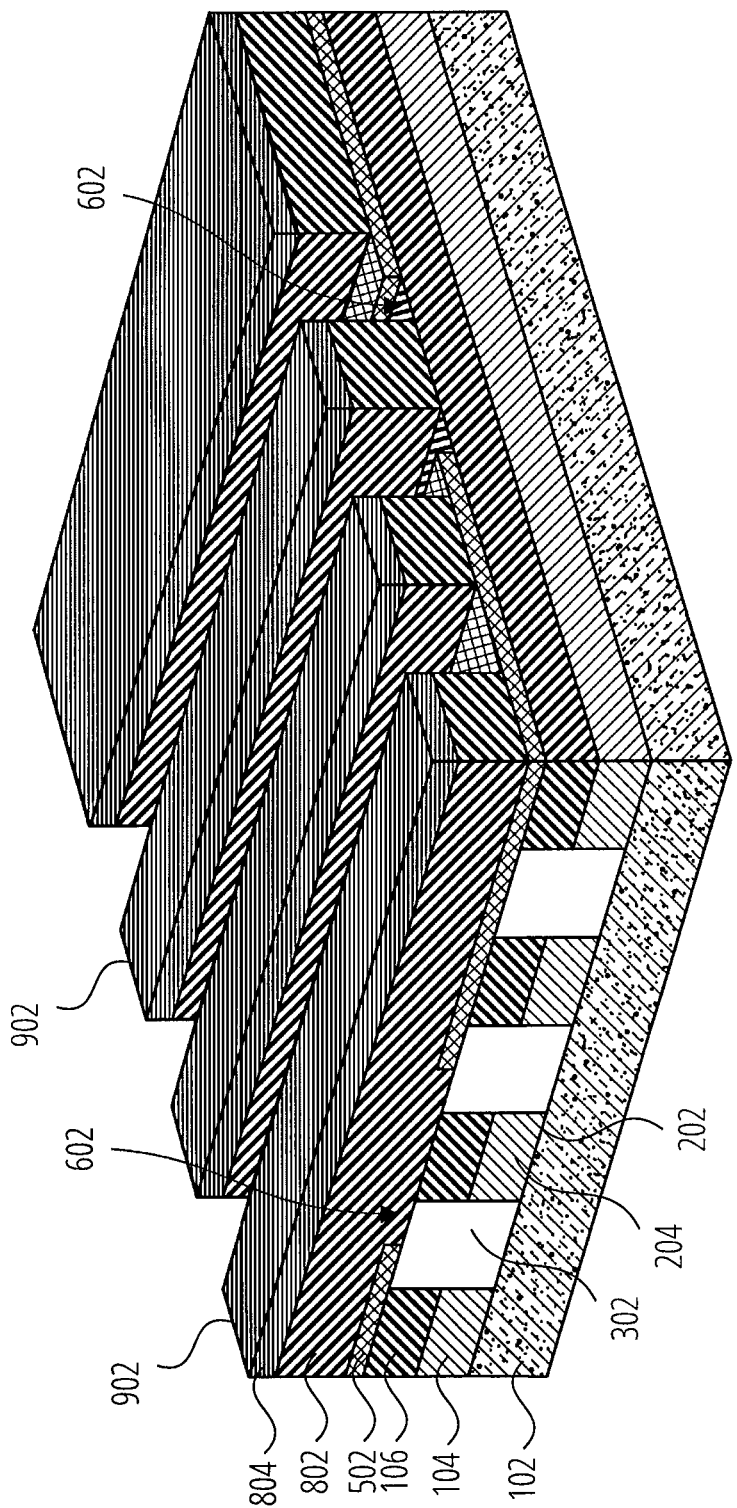

For ease of illustration for the subsequent processing stages of embodiments of the disclosure, subsequent processing stage illustrations are taken along segment lines X-X and Y-Y of FIG. 9. Therefore, the illustration of FIG. 10 is a cut-away view of FIG. 9, cutting along the segment lines X-X and Y-Y of FIG. 9. The segment lines X-X and Y-Y pass through a respective one of the openings 602, along a sidewall or end of the second sacrificial material 802 of the elongate structures 902. FIG. 10 therefore illustrates this other cross-sectional view, relative to FIG. 9, but does not illustrate additional fabrication processing from the stage illustrated in FIG. 9. The subsequent FIG. 11 through FIG. 21 likewise maintain the same X-X and Y-Y cut-away sectional view, though with illustrations of additional fabrication processing, as discussed below.

Figure 11:
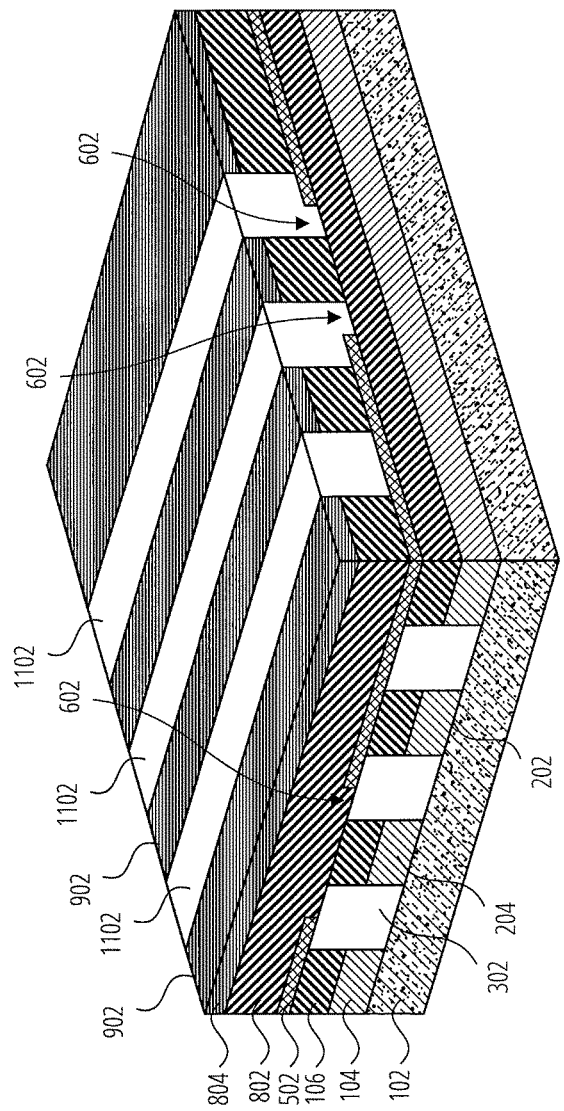

With the second sacrificial material 802 and the other hardmask 804 patterned into the elongate structures 902, space between the elongate structures 902 may then be filled with a fill material(s) 1102, as illustrated in FIG. 11. The fill material(s) 1102 may comprise or consist of any of the fill material(s) described above with respect to the fill material(s) 302 adjacent the first conductive structures 204, and the fill material(s) 1102 may be formed (e.g., by deposition and planarization) as described above with respect to the fill material(s) 302 adjacent the first conductive structure 204. Therefore, an upper surface of the fill material(s) 1102 is coplanar with an upper surface of the other hardmask 804. In some embodiments, the fill material(s) 1102 may be selected to have a different chemical composition from the fill material(s) 302 adjacent the first conductive structures 204. In other embodiments, the fill material(s) 1102 and the fill material(s) 302 may have the same chemical composition.

Filling the space between the elongate structures 902 may comprise depositing the fill material(s) 1102 in one or more material deposition processes.

Figure 12:
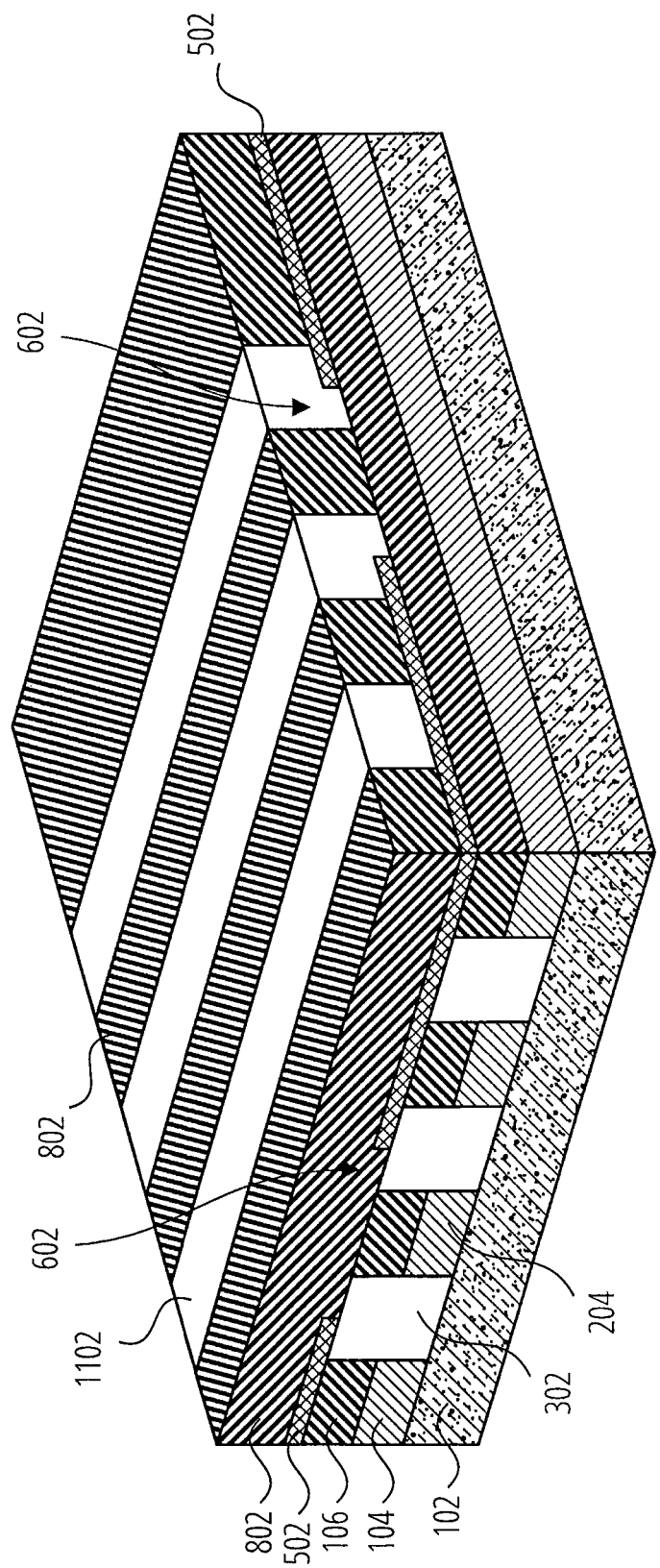

The other hardmask 804 is then removed (e.g., by planarization, such as CMP or dry etching), as illustrated in FIG. 12, leaving second sacrificial material 802 and fill material(s) 1102 exposed.

Figure 13:
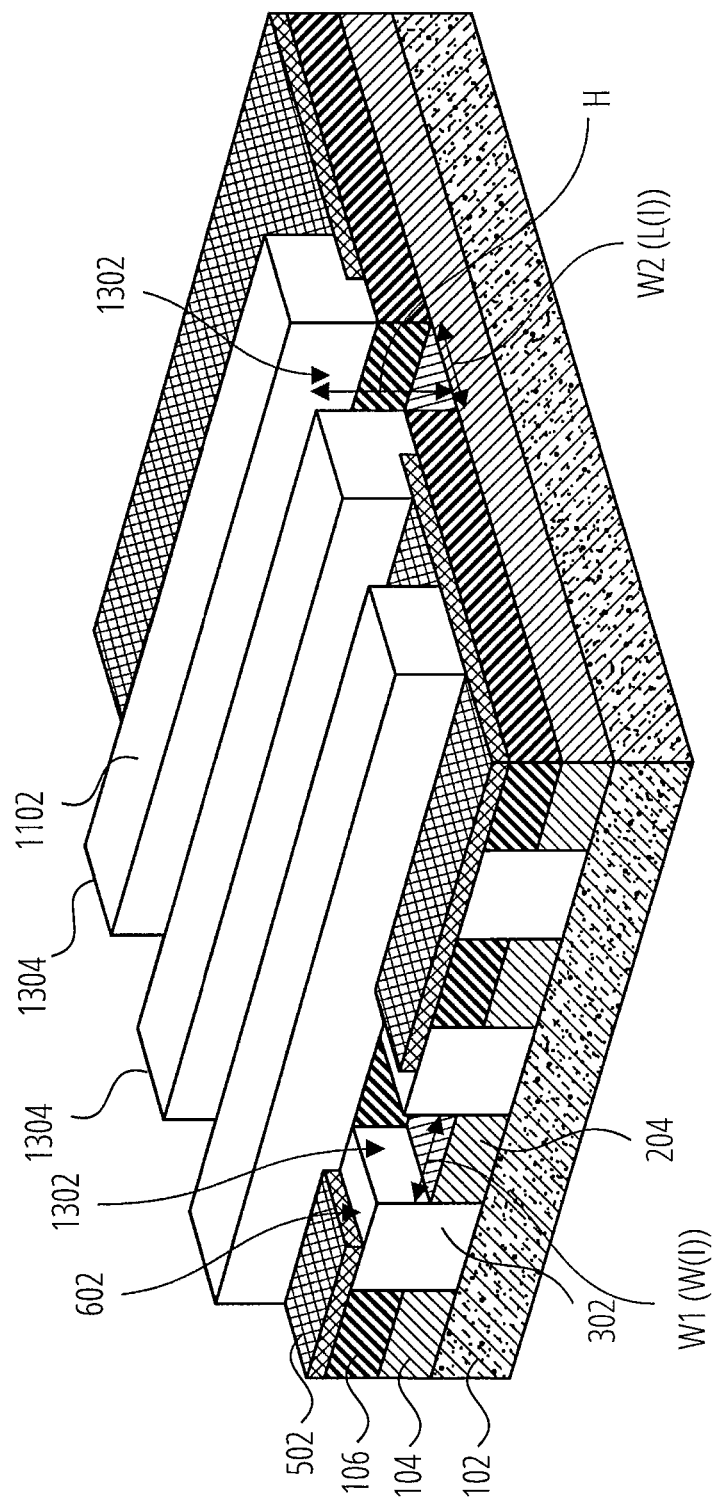

The second sacrificial material 802, which as discussed above may be a wholly-sacrificial material, may then be wholly removed (e.g., exhumed) along with removing (e.g., exhuming) the portions of the first sacrificial material 106 that were exposed by the openings 602, forming extended opening 1302 as illustrated in FIG. 13. The extended opening 1302 expose an upper surface of the first conductive material 104, of the first conductive structures 204, between elongate fill structures 1304 of the fill material(s) 1102. The extended opening 1302 and the exposed portions of the first conductive material 104 include the entire width W1 of the first conductive structures 204 because the first sacrificial material 106 and the first conductive structures 204 were patterned together. Adjacent the mouth of the extended opening 1302, the extended opening 1302 has a width equal to the width W(B) (FIG. 6) of the openings 602. However, the mouth of the extended opening 1302 does not share the length L(B) (FIG. 6) of the openings 602 because the length L(I) of the extended opening 1302 is defined by and equal to the width W2 that was defined by the elongate structures 902 of the second sacrificial material 802 (FIG. 9). Finally, the extended opening 1302 has a depth of H, equal to a height of the interconnects to be formed plus the height of upper conductive structures to be formed.

Figure 14:
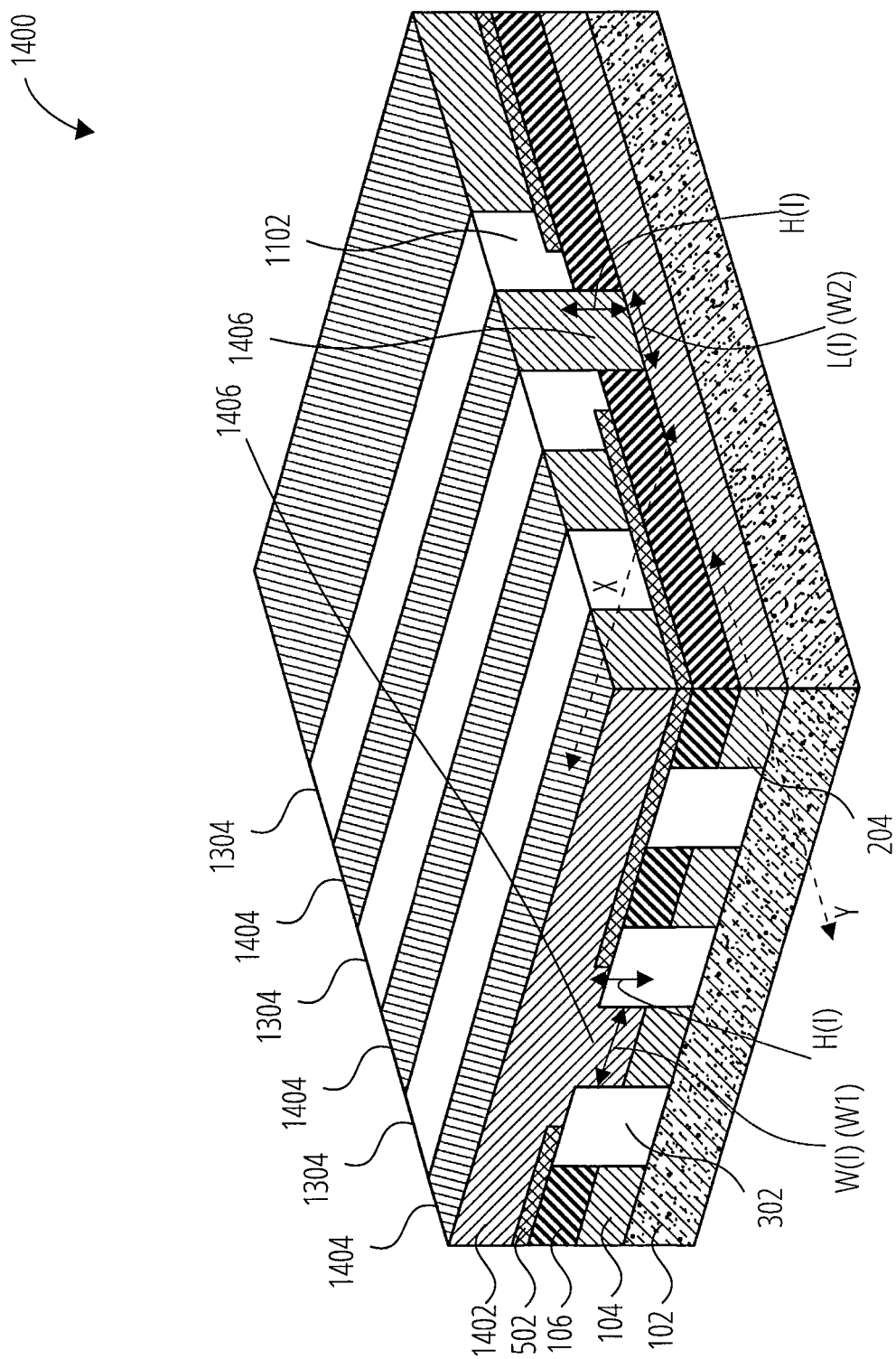

The extended opening 1302 effectively defines a negative space mold in which, as illustrated in FIG. 14, one or more other conductive material(s) 1402 are formed (e.g., deposited) to fabricate second conductive structures 1404 and interconnects 1406. Accordingly, the other conductive material(s) 1402 may be formed by a damascene process, though the other conductive material(s) 1402 extends into a lower level of materials patterned along with the first conductive material 104 of the first conductive structures 204. The interconnects 1406 have the total height H(I) equal to, or substantially equal to, the height H1(I) (FIG. 6) of the first sacrificial material 106 plus the thickness H2(I) (FIG. 6) of the blocking material 502.

In some embodiments, the other conductive material(s) 1402 may be formed in one deposition act of one or more conductive materials, which may be the same or different than the conductive material(s) of the first conductive material 104 of the first conductive structures 204. However, because the other conductive material(s) 1402 are formed by a damascene process, even hard-to-pattern conductive materials, such as copper (Cu), may be included in the other conductive material(s) 1402.

The other conductive material(s) 1402 may be formed to overfill the extended opening 1302 and may then be subjected to planarization (e.g., CMP) to planarize an upper surface of the microelectronic device structure 1400, making the upper surface of the other conductive material(s) 1402 coplanar with an upper surface of the fill material(s) 1102 and forming second conductive structures 1404 spaced from one another by fill material(s) 1102 of the elongate fill structures 1304.

In some embodiments, a barrier, seed, and/or nucleation material may be conformally formed within the extended opening 1302 (FIG. 13) before forming a primary conductive material of the other conductive material(s) 1402. Therefore, the other conductive material(s) 1402 may include barrier materials and/or seed materials. For example, in some embodiments, the other conductive material(s) 1402 comprises copper (Cu) as the primary (e.g., majority) conductive material, a barrier material (e.g., a nitride, such as tantalum nitride, titanium nitride, and/or tungsten nitride; a silicon-containing barrier material; or a combination of such barrier materials, such as a bi-layer of different barrier materials) may be conformally formed (e.g., deposited) along the surfaces that define the extended opening 1302 (FIG. 13) before copper (Cu) is formed to fill the remainder of the extended opening 1302. Such barrier material(s) may also function as seed materials, promoting the growth of copper (Cu) conformally on the seed materials to fill the extended opening 1302. As another example, in some embodiments the other conductive material(s) 1402 may comprise tungsten as the primary conductive material with a first-formed nucleation layer to promote adhesion of the tungsten.

Forming the other conductive material(s) 1402 to fill the extended opening 1302 (FIG. 13) integrally forms the second conductive structures 1404 with the interconnects 1406; therefore, the interconnects 1406 are self-aligned with the second conductive structures 1404. The second conductive structures 1404 are also self-aligned with the first conductive structures 204 because at least one lateral dimension (e.g., width W(I)) of the interconnects 1406 was defined by the subtractive patterning that formed the first conductive structures 204 at width WI, which equals W(I). That is, the interconnects 1406 is formed only within the volume between overlapping areas of the first conductive structures 204 and the second conductive structures 1404. Therefore, a horizontal cross-sectional area of each of the interconnects 1406 is the same as the area in which the first conductive structures 204 and the second conductive structures 1404 overlap (e.g., vertically overlap) one another. Therefore, as can be seen in FIG. 14, each pair of vertical sidewalls of the interconnects 1406 may align with (e.g., be coplanar with) a corresponding pair of vertical sidewalls of the first conductive structures 204 and the second conductive structures 1404. For example, the vertical sidewalls of the interconnects 1406 that are intersected by an x-axis (indicated by arrow X in FIG. 14) are coplanar with the vertical sidewalls of the first conductive structures 204 that are intersected by the x-axis; and, the vertical sidewalls of the interconnects 1406 that are intersected by a y-axis (indicated by arrow Y in FIG. 14) are coplanar with vertical sidewalls of the second conductive structures 1404 that are intersected by the y-axis. As such, the interconnects 1406 may be characterized as being "perfectly aligned" with the first conductive structures 204 and the second conductive structures 1404 in that the interconnects 1406 may not overhang or laterally extend beyond the sidewalls of the first conductive structures 204 and may not overhang or laterally extend beyond the sidewalls of the second conductive structures 1404.

Accordingly, disclosed is a method of forming a microelectronic device structure. The method comprises patterning a first conductive material and a first sacrificial material to form at least one first feature comprising a first conductive structure. A dielectric material is formed adjacent the at least one first feature. Another dielectric material is formed on the first sacrificial material and the dielectric material. At least one opening is formed through the other dielectric material to expose at least one portion of the first sacrificial material. A second sacrificial material is formed on the other dielectric material and on the at least one portion of the first sacrificial material exposed by the at least one opening. The second sacrificial material is patterned to form at least one second feature. An additional dielectric material is formed adjacent the at least one second feature. The second sacrificial material and the at least one portion of the first sacrificial material are removed to form extended openings exposing therein at least one portion of the first conductive material. The extended openings are then filled with a second conductive material to form at least one interconnect in each of the extended openings.

FIG. 14 also illustrates a microelectronic device structure 1400 that includes the interconnects 1406 self-aligned with both lower conductive structures (e.g., the first conductive structures 204) and upper conductive structures (e.g., the second conductive structures 1404), wherein the interconnected conductive structures are directed in intersecting directions. For example, the first conductive structures 204 are illustrated as directed along the y-axis (indicated by arrow Y), while the second conductive structures 1404 are illustrated as directed along the x-axis (indicated by arrow X). In other words, the direction of the elongated length of the respective conductive structures are not colinear. By forming the microelectronic device structure 1400 using the methods discussed above, the interconnects 1406 may be formed only where the first conductive structures 204 and the second conductive structures 1404 vertically overlap one another, if such overlapping region coincides with one of the openings 602 (FIG. 6) in the blocking material 502. Where the blocking material 502 intervenes between overlapping regions of the first conductive structures 204 and the second conductive structures 1404, no interconnect is formed. Therefore, the patterning of the blocking material 502 enables selection of the locations for the interconnects 1406, and the aforementioned methods of fabrication enable the self-alignment of the interconnects 1406 with both the first conductive structures 204 and the second conductive structures 1404.

In the microelectronic device structure 1400, a lower portion of each of the interconnects 1406 is disposed between segments of the remaining portions of the first sacrificial material 106, which segments define the same width W1 as the first conductive structures 204.

In some embodiments, the microelectronic device structure 1400 includes the blocking material 502 and at least a portion of the first sacrificial material 106 between (e.g., vertically between) overlapping portions of the first conductive material 104 and the other conductive material(s) 1402, at least where one of the interconnects 1406 is not present. Where the first sacrificial material 106 overlaps the first conductive material 104, the materials have coplanar vertical sidewalls.

Accordingly, disclosed is a microelectronic device structure that comprises an interconnect between a lower conductive structure and an upper conductive structure. The interconnect occupies a volume between the lower conductive structure and the upper conductive structure only where the lower conductive structure and the upper conductive structure vertically overlap one another. The interconnect extends through a dielectric material.

Figure 15:
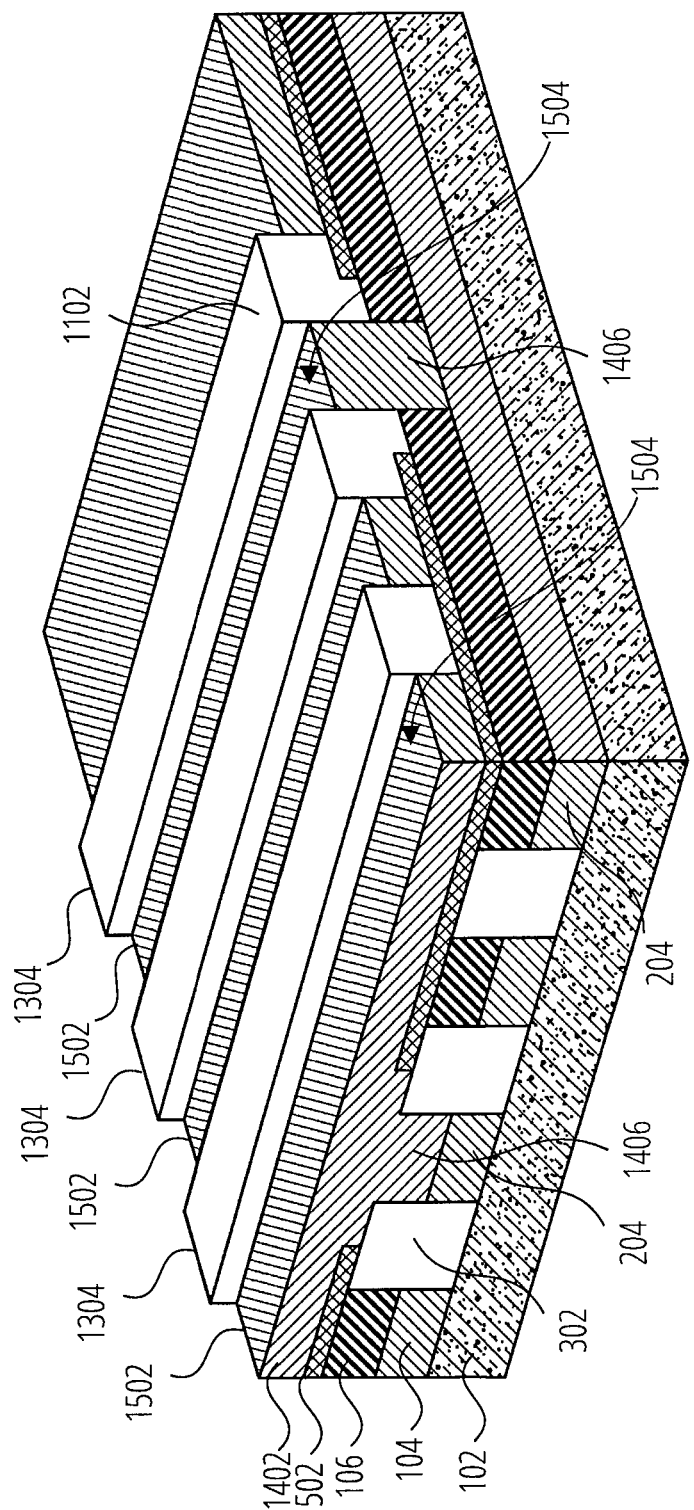
FIG. 15 through FIG. 21 are cross-sectional, isometric, schematic illustrations during various stages of processing, in conjunction with and following the stages illustrated in FIG. 1 to FIG. 14, to fabricate a microelectronic device structure including multiple levels of interconnects self-aligned with conductive structures that are directed in intersecting directions.

While the microelectronic device structure 1400 of FIG. 14 illustrates only two levels of interconnected conductive structures (e.g., the lower conductive structures of the first conductive structures 204 and the upper conductive structures of the second conductive structures 1404), methods of this disclosure may also be adapted to forming microelectronic device structures with more than two levels of interconnected conductive structures, with multiple interconnects that are self-aligned with a respective pair of second conductive structures above and below. Such a method may continue from the fabrication stage illustrated in FIG. 14 by removing (e.g., by etching) a portion of the other conductive material(s) 1402 to recess the other conductive material(s) 1402, as illustrated in FIG. 15, relative to the fill material(s) 1102. The remaining other conductive material(s) 1402 are structured in recessed elongate features 1502 with recesses 1504 above the other conductive material(s) 1402 and between sidewalls of the fill material(s) 1102.

The recesses 1504 may then be filled by forming (e.g., depositing) additional amounts of the first sacrificial material 106 (or another partially-sacrificial material of the materials discussed above with respect to the first sacrificial material 106 on the first conductive material 104, provided the selected sacrificial material is formulated to be removable selective to the fill material(s) 1102). In some embodiments, the additional amounts of the first sacrificial material 106 may be formed to initially overfill the recesses 1504 and then planarized (e.g., by CMP) to expose the fill material(s) 1102 through the first sacrificial material 106. The resulting structure, illustrated in FIG. 16, essentially provides a similar processing stage to that of FIG. 3 with the additional amounts of the first sacrificial material 106 defining a pattern matching that of the other conductive material(s) 1402 of second conductive structures 1602 upon which the first sacrificial material 106 is formed. However, while the first sacrificial material 106 on the first conductive structures 204 were subtractively patterned along with the first conductive material 104, the first sacrificial material 106 on the second conductive structures 1602 are additively formed (e.g., by a damascene process) within negative space defined by the recesses 1504.

Figure 16:
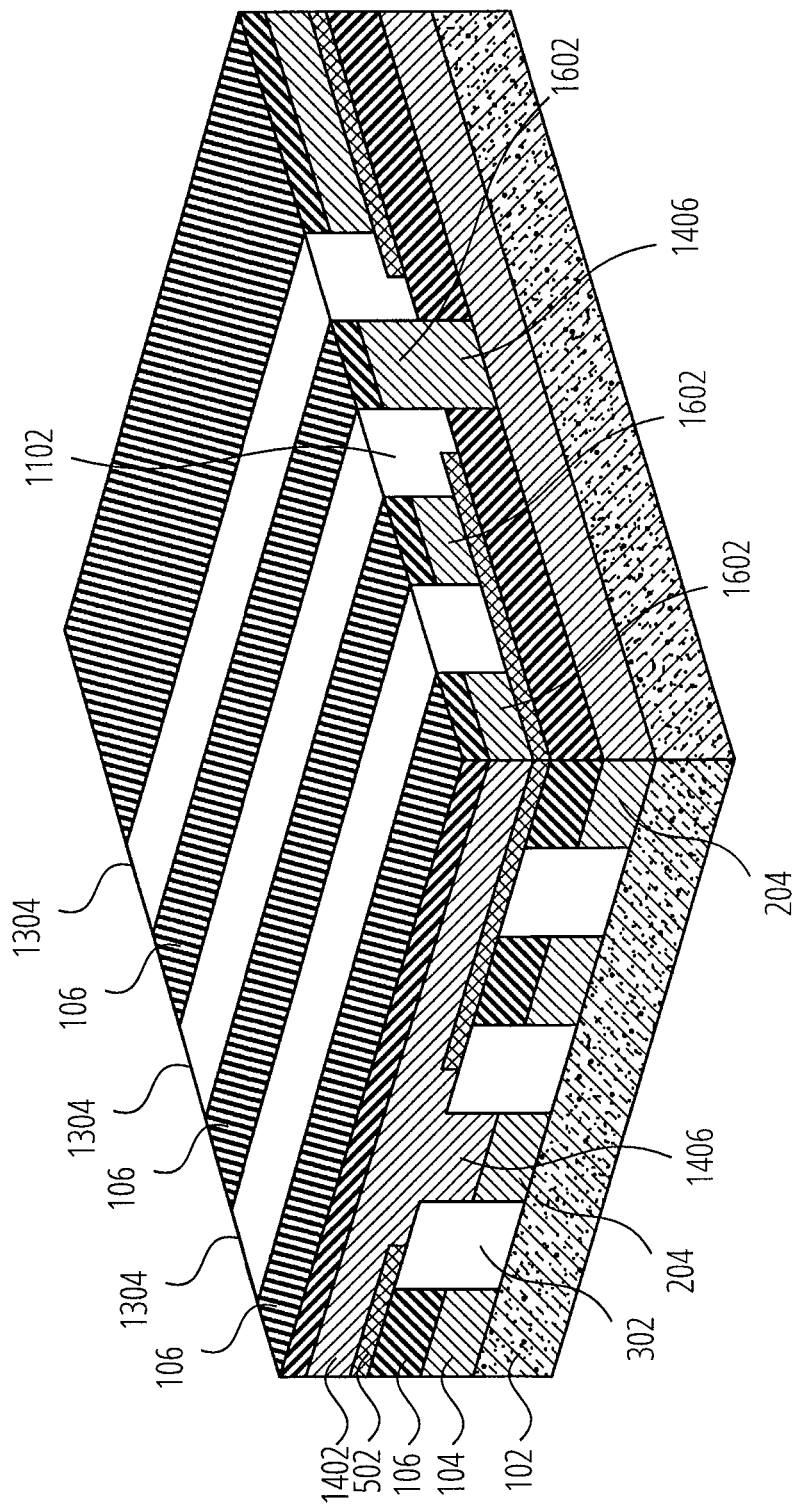
Figure 17:
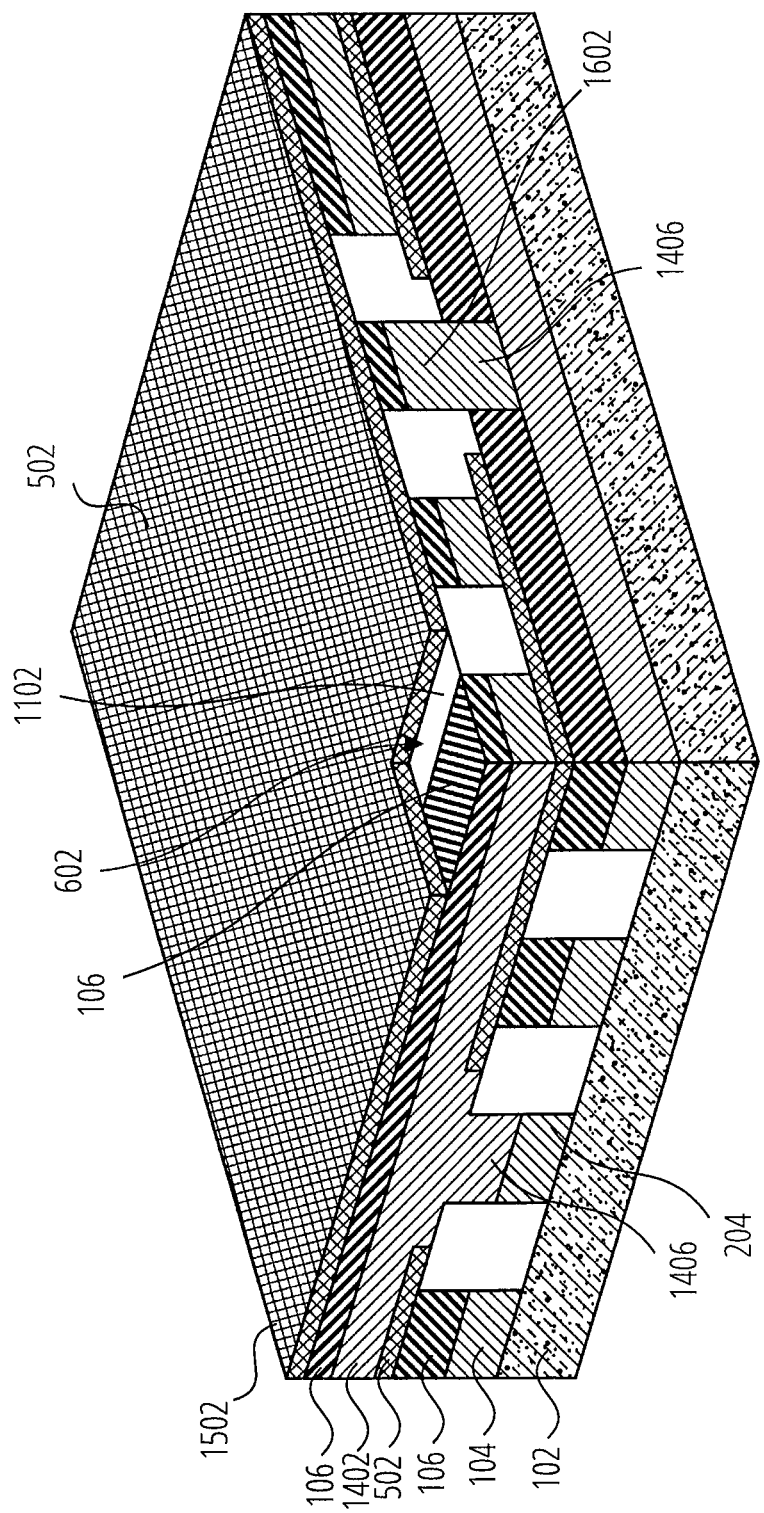

With reference to FIG. 17, and similarly to the processing stages of FIG. 5 through FIG. 7, another structure of the blocking material 502 may then be formed on the structure of FIG. 16, covering the first sacrificial material 106 on the second conductive structures 1602 and covering the fill material(s) 1102 between the second conductive structures 1602. One or more additional openings 602 may then be formed (e.g., etched) through the blocking material 502 where additional interconnects are to be formed. The one or more additional openings 602 expose at least one portion of the first sacrificial material 106 and, optionally, portions of the fill material(s) 1102. As with the openings 602 formed over the first conductive structures 204 (FIG. 7), in some embodiments, the openings 602 formed over the second conductive structures 1602 may be sized and positioned to form interconnects connecting to more than one of the second conductive structures 1602, if electrical connection by an interconnect to more than one of the second conductive structures 1602 is desired. Therefore, the size and positioning of the openings 602, whether over the first conductive structures 204 or over the second conductive structures 1602, etc., may be tailored to provide electrical connection between a pair of conductive structures, with one above and one below; between one conductive structure below and multiple conductive structures above; between multiple conductive structures below and one conductive structure above; or between multiple conductive structures below and multiple conductive structures above, as desired.

Figure 18:
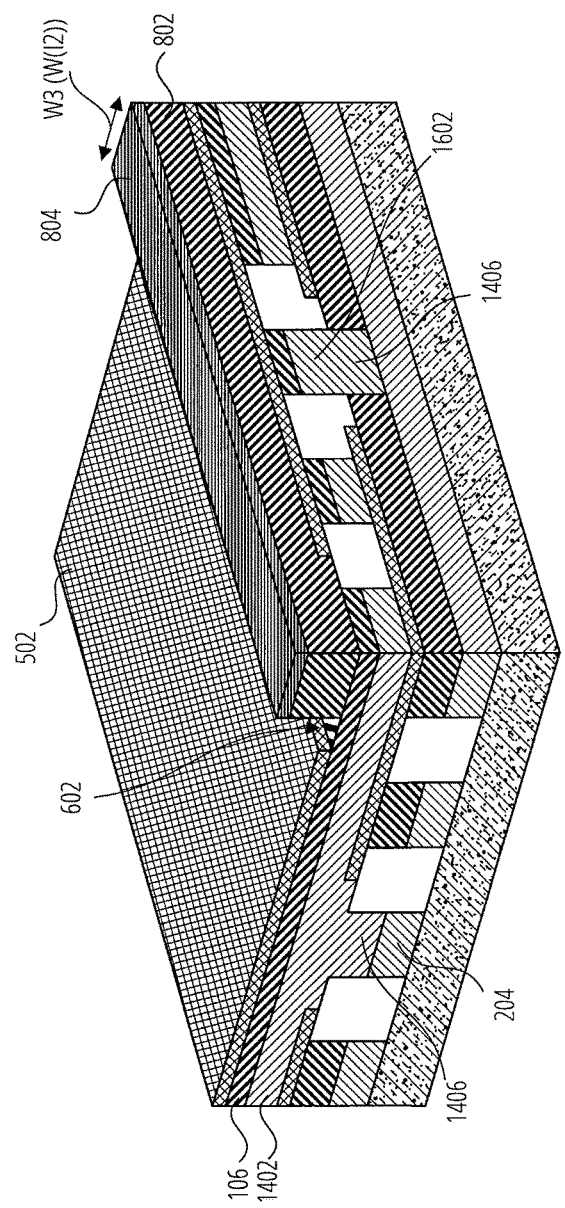

With reference to FIG. 18, and similarly to the processing stages of FIG. 8 through FIG. 10, an additional amount of the second sacrificial material 802 (or another wholly-sacrificial material of the materials discussed above with respect to the second sacrificial material 802 later replaced by the other conductive material(s) 1402 of the second conductive structures 1602) and another portion of the other hardmask 804 may then be formed (e.g., deposited) and patterned to define a width W3, which defines and therefore equals a width W(I2) of the additional interconnect(s) to be formed. The second sacrificial material 802 may be in direct physical contact with the first sacrificial material 106 in the one or more openings 602.

Figure 19:
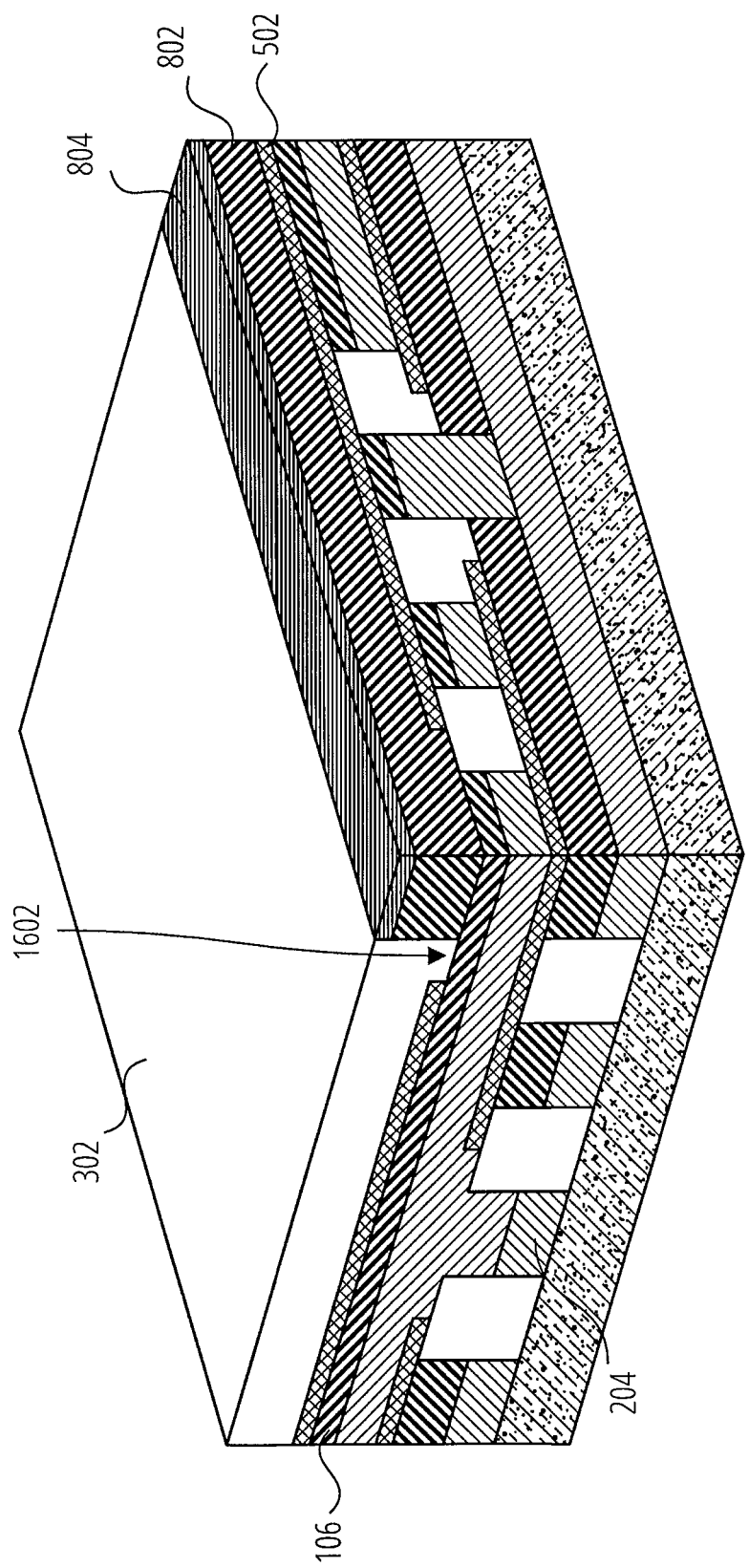

With reference to FIG. 19, and similar to the processing stages of FIG. 11 and FIG. 12, additional amount(s) of the fill material(s) 302 (or another fill material of the materials discussed above with respect to the fill material(s) 302 adjacent the first conductive structures 204) may be formed (e.g., deposited and planarized) to fill space adjacent the patterned second sacrificial material 802.

Figure 20:
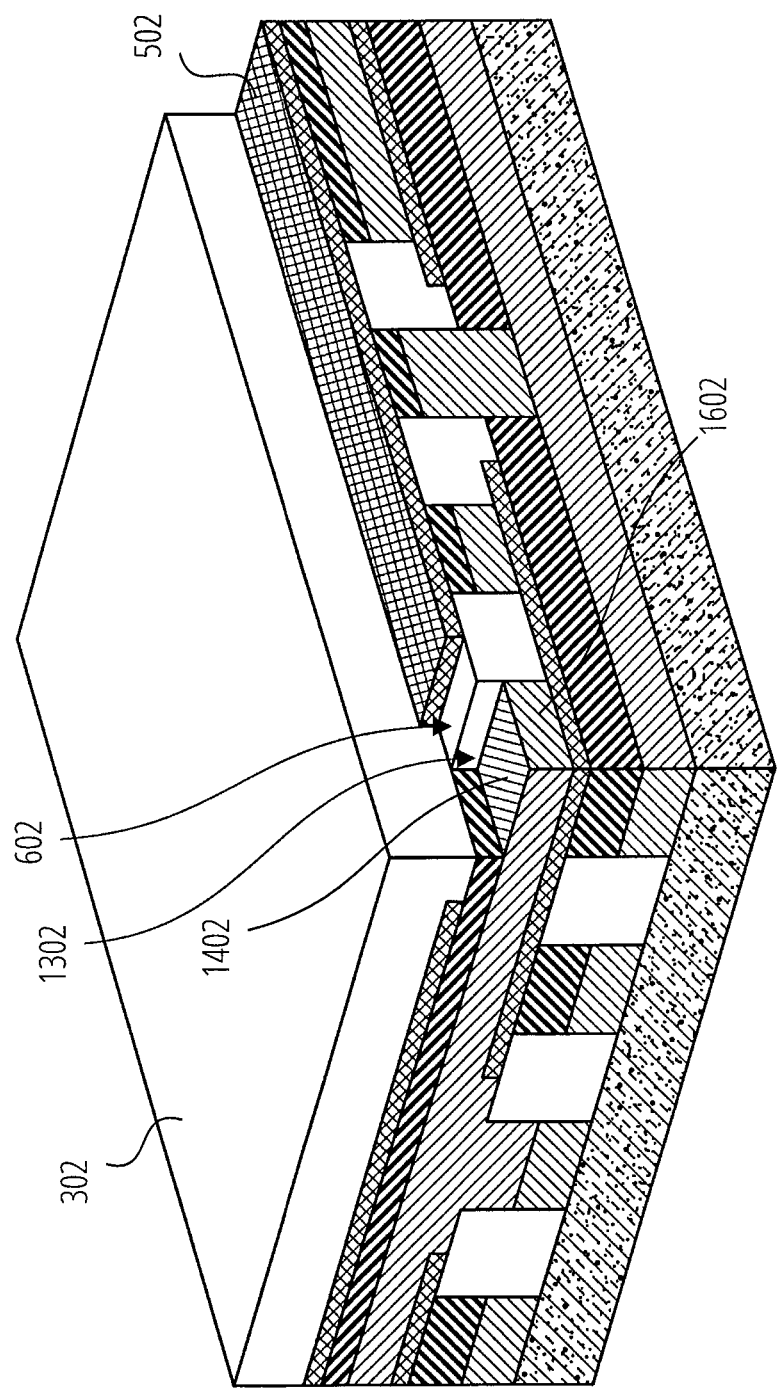

With reference to FIG. 20, and similar to the processing stage of FIG. 13, the second sacrificial material 802 may be removed (e.g., etched), leaving extended opening 1302 that expose a portion of the upper surface of the other conductive material(s) 1402 along with a portion of the openings 602 and a portion of the blocking material 502.

Figure 21:
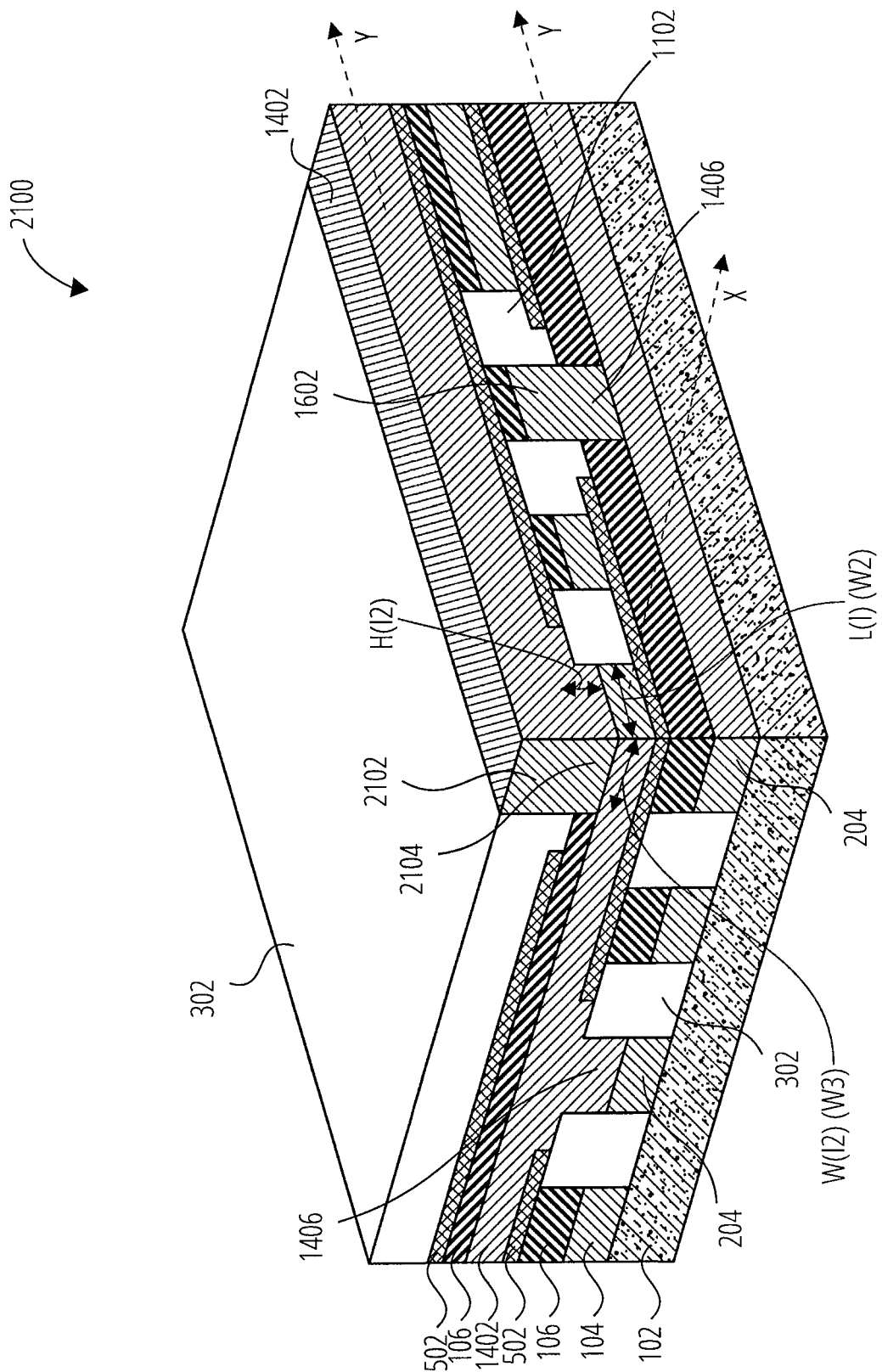

With reference to FIG. 21, and similar to the processing stage of FIG. 14, the extended opening 1302 (FIG. 20) may then be filled with other conductive material(s) 1402, which may have substantially the same material composition as, or a different material composition than, the other conductive material(s) 1402 of the second conductive structures 1602, to form a third conductive structure 2102 integrally formed with an additional interconnect 2104, the additional interconnect 2104 being in physical contact with the portion of the other conductive material(s) 1402 of the second conductive structures 1602 that was exposed by the extended opening 1302 of FIG. 20.

The additional interconnect 2104 is self-aligned with both the second conductive structures 1602 and the third conductive structure 2102. The additional interconnect 2104 has width W(I2), which was defined by and is equal to a width W3 of the additional interconnect 2104; length L(I), which was defined by and is equal to width W2 of the second conductive structures 1602; and height H(I2), which was defined by and is equal to the thickness of the first sacrificial material 106 formed in the recesses 1504 of FIG. 15 plus the thickness of the blocking material 502 formed on (e.g., above) the second conductive structures 1602. The additional interconnect 2104 has pairs of vertical sidewalls that are coplanar with corresponding pairs of vertical sidewalls of the second conductive structures 1602 and the third conductive structure 2102, without overhanging portions.

Accordingly, disclosed is a method of forming a microelectronic device structure. An elongate feature is subtractively formed, and the elongate feature comprises a first sacrificial material on a first conductive structure. A dielectric material is formed on the first sacrificial material. An opening is formed through the dielectric material to expose a portion of the first sacrificial material. A second sacrificial material is formed on the portion of the first sacrificial material in the opening. The second sacrificial material is patterned to form another elongate feature. Another dielectric material is formed adjacent the other elongate feature. The second sacrificial material and the portion of the first sacrificial material are removed to form another opening exposing a portion of the first conductive structure. At least one second conductive material is additively formed on the portion of the first conductive structure in the other opening to form a second conductive structure integrally formed with an interconnect in physical contact with the first conductive structure.

FIG. 21 also illustrates a microelectronic device structure 2100 that includes multiple interconnects that are self-aligned with multiple levels of conductive structures with each level arranged in a direction that intersects with the direction of conductive structures of at least one other level. For example, as illustrated in FIG. 21, the first conductive structures 204 and the third conductive structure 2102 are directed along the y-axis (indicated by arrows Y), while the second conductive structures 1602 are directed along the x-axis (indicated by arrows X). Though the intersecting directions of FIG. 21 are illustrated to be substantially perpendicular, in other embodiments, the intersecting directions may be at acute or obtuse angles if defined in an x-y plane. Nonetheless, the interconnects 1406 and the additional interconnect 2104 are formed, by embodiments of this disclosure, in a manner that they self-align with the conductive structures above and below, being formed only where the conductive structures vertically overlap and provided the blocking material 502 does not intervene (e.g., due to selectively formed openings 602).

Figure 22:
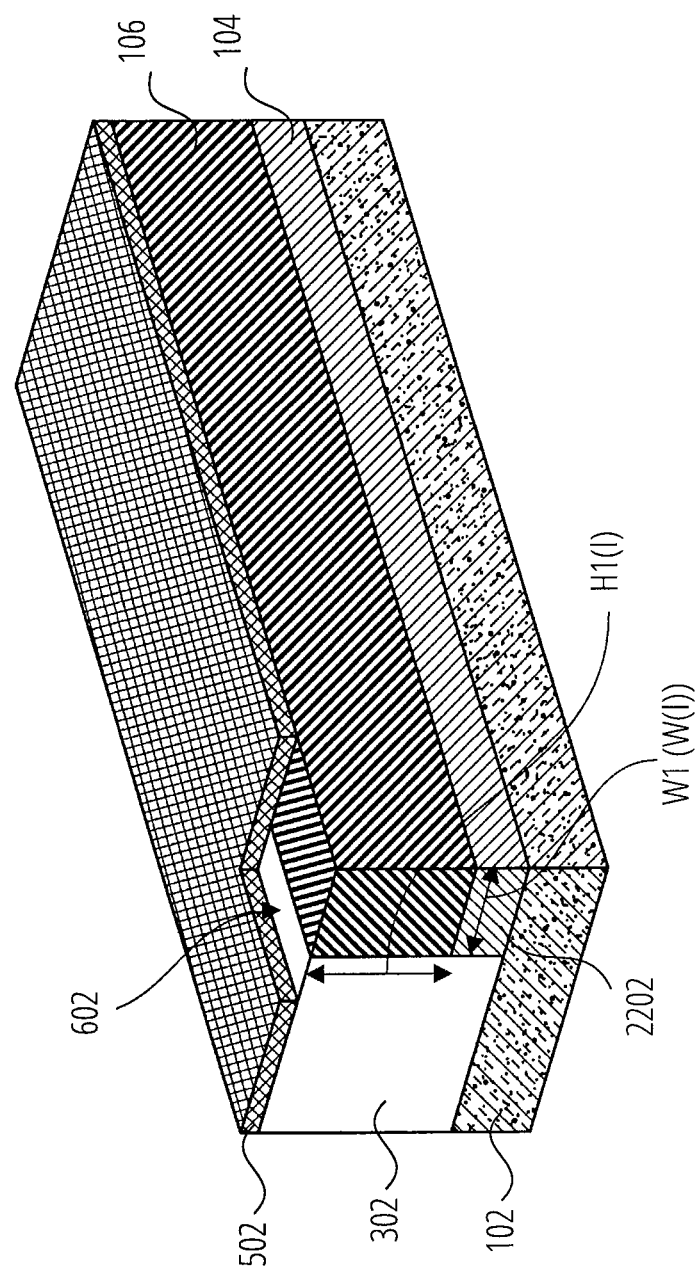
FIG. 22 through FIG. 25 are cross-sectional, isometric, schematic illustrations during various stages of processing to fabricate a microelectronic device structure including an interconnect self-aligned with conductive structures that are directed in colinear directions.

Embodiments of the disclosure may also be used to form microelectronic device structures with interconnects that are self-aligned with conductive structures that are directed in colinear directions. For example, with reference to FIG. 22, the first conductive material 104 and the first sacrificial material 106 may be formed and subtractively patterned to form at least one first conductive structure 2202, the fill material(s) 302 formed in spaces between neighboring features of the first conductive material 104, and the blocking material 502 formed and selectively etched to form the openings 602 where interconnects are wanted (similarly to the fabrication stages of FIG. 1 to FIG. 7).

Figure 23:
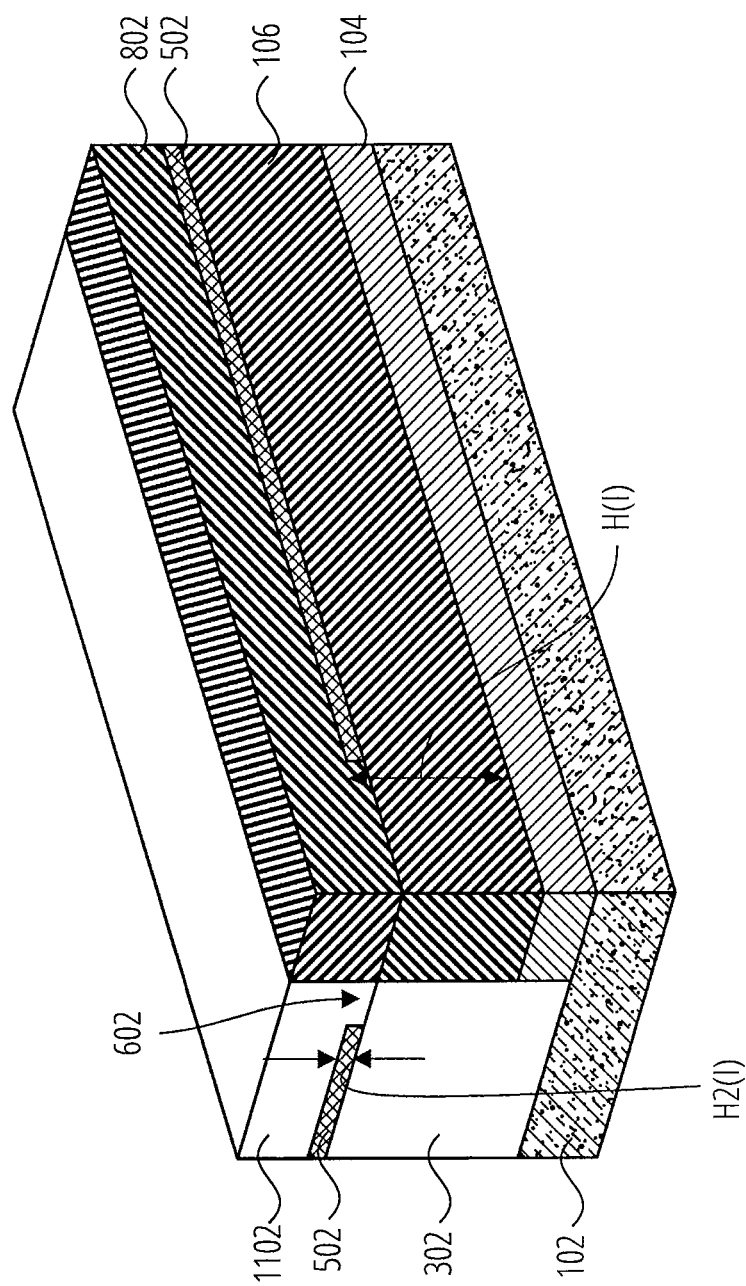

With reference to FIG. 23, the second sacrificial material 802 may be formed over the blocking material 502 and in the openings 602 and then patterned before filling empty space with the fill material(s) 1102 (similarly to the fabrication stages of FIG. 8 to FIG. 12). However, in this embodiment, the second sacrificial material 802 is patterned to define a length that is directed colinearly with the direction of the length of the first sacrificial material 106 and the first conductive material 104. For example, the first conductive material 104, the first sacrificial material 106, and the second sacrificial material 802 may all be patterned to form elongate structures directed along a y-axis.

As with embodiments discussed above, a thickness of the first sacrificial material 106 and a thickness H2(I) of the blocking material 502 defines the height H(I) of the interconnect to be formed.

Figure 24:
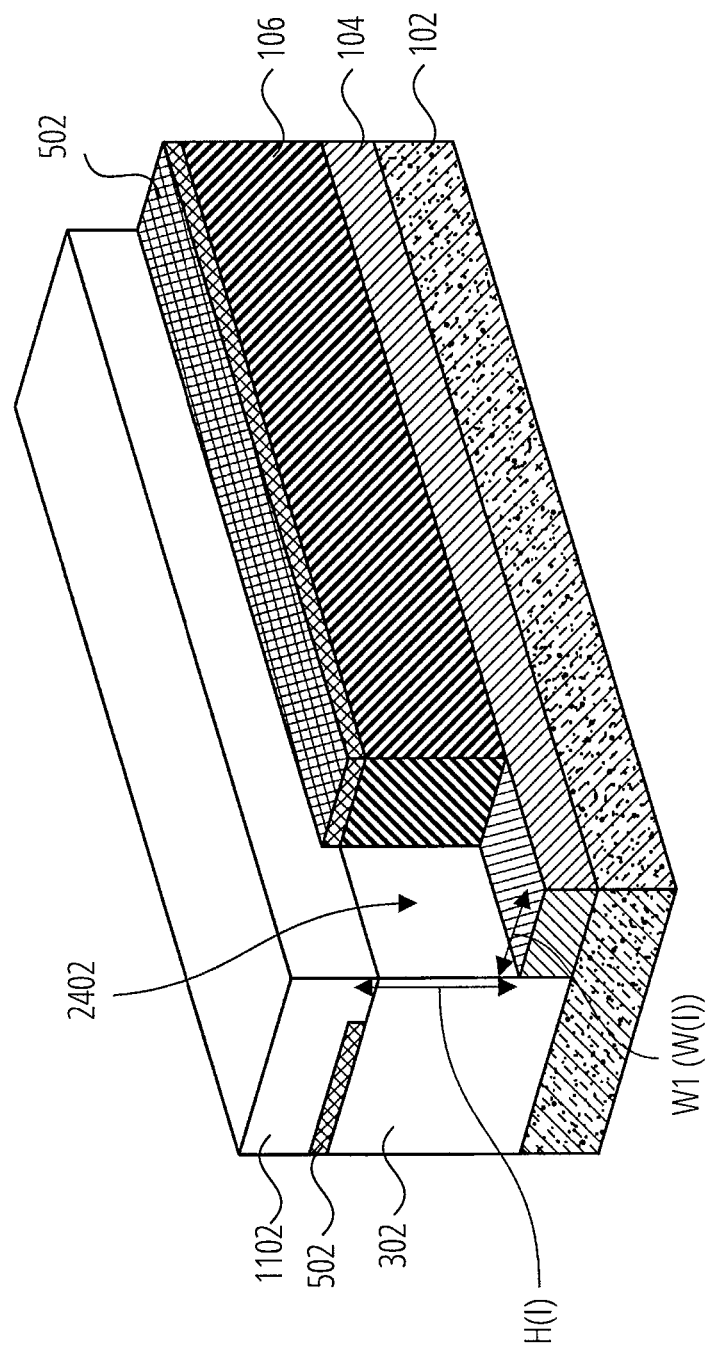

Similarly to the fabrication stage of FIG. 13, the second sacrificial material 802 may then be wholly removed (e.g., exhumed) along with the portion(s) of the first sacrificial material 106 that was exposed by the one or more openings 602, as illustrated in FIG. 24, leaving extended opening 2402 exposing a portion of the first conductive material 104. The extended opening 2402 has a width W1, defined by and equal to the width of the first conductive material 104 (and the first sacrificial material 106), which also defines the width W(I) of the interconnect to be formed. The extended opening 2402 has a depth H(I) that defines and is equal to the height of the interconnect to be formed.

Figure 25:
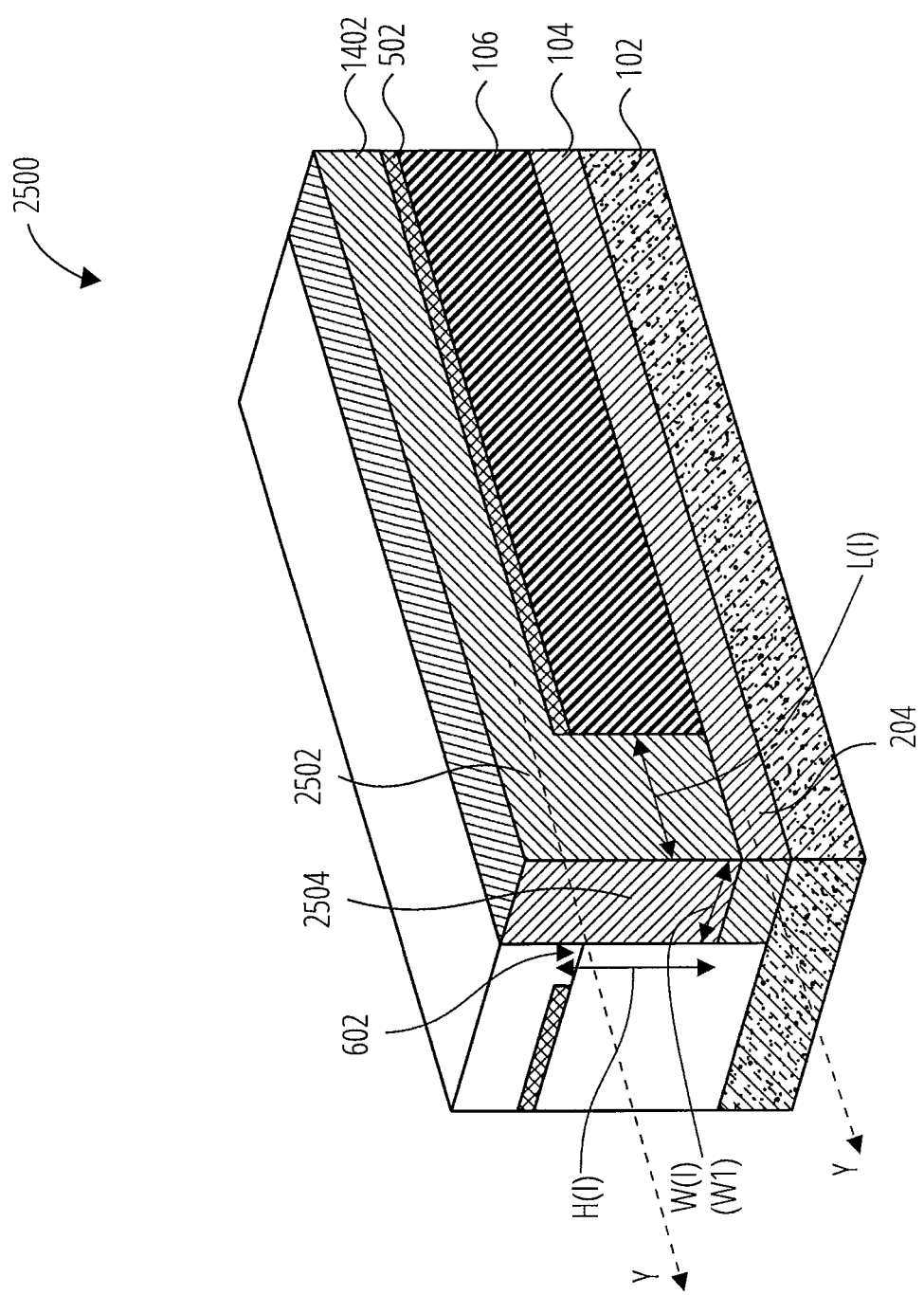

The extended opening 2402 may then be filled with the other conductive material(s) 1402, as illustrated in FIG. 25 (and similarly to the fabrication stage of FIG. 14) to integrally form a second conductive structure 2502 with an interconnect 2504.

A microelectronic device structure 2500, as illustrated in FIG. 25, includes the interconnect 2504 between colinearly directed conductive structures. A width W(I) of the interconnect 2504 is defined by the width of the second sacrificial material 802 that vertically overlapped the first sacrificial material 106 within each of the one or more openings 602. In embodiments in which the second sacrificial material 802 is patterned to perfectly align with the pattern of the first sacrificial material 106 (and the first conductive material 104) within the respective one of the openings 602, such as illustrated in FIG. 23, the width W(I) of the interconnect 2504 equals a width W1 of both the first conductive material 104 and the second conductive structure 2502. If, however, the pattern of the second sacrificial material 802 had been shifted somewhat from the pattern of the first sacrificial material 106 (and the first conductive material 104), then the width W(I) of the interconnect 2504 would be narrower, but still nonetheless self-aligned with both the first conductive material 104 and the second conductive structure 2502.

Due to the first conductive material 104 and second conductive structure 2502 being colinearly directed, in this embodiment a length L(I) of the interconnect 2504 is defined not by a length or width of either the first conductive material 104 or the second conductive structure 2502, but by the length of the respective one of the openings 602. Therefore, the longer the openings 602 are formed, the broader the first conductive structure 2202 will be. So, the length of the openings 602 may be tailored according to the design needs for the length L(I) of the interconnect 2504.

Accordingly, disclosed is a microelectronic device structure. The microelectronic device structure comprises a first conductive structure vertically overlapping a second conductive structure. An interconnect is integral with the second conductive structure and is disposed directly between the first conductive structure and the second conductive structure. The interconnect comprises at least one vertical sidewall coplanar with at least one vertical sidewall of the first conductive structure. At least one other vertical sidewall of the interconnect is coplanar with at least one vertical sidewall of the second conductive structure. A dielectric material is between the first conductive structure and the second conductive structure. The dielectric material defines at least one opening through which the interconnect extends.

Figure 26:
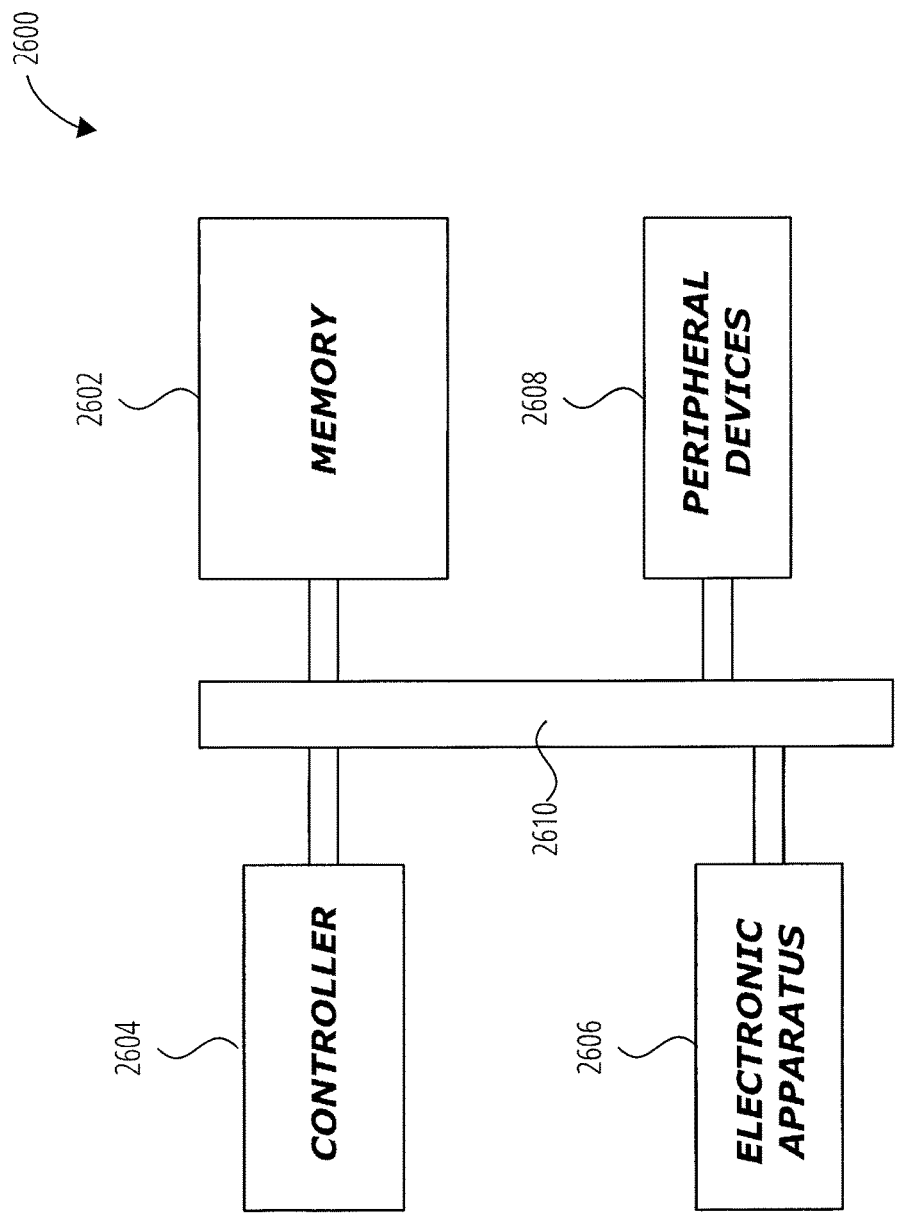
FIG. 26 shows a block diagram of an electronic system including a microelectronic devices according to embodiments of the disclosure.

FIG. 26 shows a block diagram of a system 2600, according to embodiments of the disclosure, which system 2600 includes memory 2602 including multiple levels of electrically interconnected conductive structures. The architecture and structure of the memory 2602 may include the microelectronic device structure 1400 of FIG. 14, the microelectronic device structure 2100 of FIG. 21, and/or the microelectronic device structure 2500 of FIG. 25, according to embodiments of the disclosure, and may be fabricated according to one or more of the methods described above with reference to FIG. 1 through FIG. 25.

The system 2600 may include a controller 2604 operatively coupled to the memory 2602. The system 2600 may also include another electronic apparatus 2606 and one or more peripheral device(s) 2608. The other electronic apparatus 2606 may, in some embodiments, include one or more of the microelectronic device structure 1400 of FIG. 14, the microelectronic device structure 2100 of FIG. 21, and/or the microelectronic device structure 2500 of FIG. 25, according to embodiments of the disclosure and fabricated according to one or more of the methods described above. One or more of the controller 2604, the memory 2602, the other electronic apparatus 2606, and the peripheral device(s) 2608 may be in the form of one or more integrated circuits (ICs).

A bus 2610 provides electrical conductivity and operable communication between and/or among various components of the system 2600. The bus 2610 may include an address bus, a data bus, and a control bus, each independently configured. Alternatively, the bus 2610 may use conductive lines for providing one or more of address, data, or control, the use of which may be regulated by the controller 2604. The controller 2604 may be in the form of one or more processors.

The other electronic apparatus 2606 may include additional memory (e.g., with one or more of the microelectronic device structure 1400 of FIG. 14, the microelectronic device structure 2100 of FIG. 21, and/or the microelectronic device structure 2500 of FIG. 25, according to embodiments of the disclosure and fabricated according to one or more of the methods described above). Other memory structures of the memory 2602 and/or the other electronic apparatus 2606 may be configured in an architecture such as 3D NAND, dynamic random access memory (DRAM), static random access memory (SRAM), synchronous dynamic random access memory (SDRAM), synchronous graphics random access memory (SGRAM), double data rate dynamic RAM (DDR), double data rate SDRAM, and/or magnetic-based memory (e.g., spin-transfer torque magnetic RAM (STT-MRAM)).

The peripheral device(s) 2608 may include displays, imaging devices, printing devices, wireless devices, additional storage memory, and/or control devices that may operate in conjunction with the controller 2604.

The system 2600 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is a system comprising at least one microelectronic device structure, at least one processor, and at least one peripheral device. The at least one microelectronic device structure comprises at least one interconnect between a lower conductive structure and an upper conductive structure. The at least one interconnect extends through a discrete opening in a dielectric material. A horizontal cross-sectional area of the interconnect is an area in which the upper conductive structure vertically overlaps the lower conductive structure. The at least one processor is in operable communication with the at least one microelectronic device structure. The at least one peripheral device is in operable communication with the at least one processor.

While the disclosed structures, apparatus, systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   an interconnect between at least one lower conductive structure and at least one upper conductive structure, the interconnect occupying a volume between the at least one lower conductive structure and the at least one upper conductive structure only where the at least one lower conductive structure and the at least one upper conductive structure vertically overlap one another; and
   a blocking material comprising a dielectric material through which the interconnect extends, the blocking material disposed laterally between the at least one lower conductive structure and the at least one upper conductive structure.

2. The microelectronic device of claim 1, wherein a lower portion of the interconnect is between segments of a partially-sacrificial material, one of the segments of the partially-sacrificial material having a width equal to a width of one of the at least one lower conductive structure.

3. The microelectronic device of claim 1, wherein a material of the at least one upper conductive structure and a material of the interconnect comprise a same material.

4. The microelectronic device of claim 1, wherein a material of the at least one upper conductive structure and a material of the interconnect comprise different materials.

5. The microelectronic device of claim 1, wherein a width of a portion of the interconnect above the dielectric material is greater than a width of one of the at least one lower conductive structure.

6. The microelectronic device of claim 5, wherein a width of one of the at least one upper conductive structure is greater than a width of the interconnect.

7. The microelectronic device of claim 5, wherein a length of the interconnect is equal to a width of one of the at least one upper conductive structure.

8. A microelectronic device, comprising:
   a first conductive structure at least partially vertically overlapped by a second conductive structure; and
   a blocking material comprising a dielectric material disposed laterally between the first conductive structure and the second conductive structure, the blocking material defining at least one opening between the first conductive structure and the second conductive structure through which an interconnect extends,
   the interconnect integral with the second conductive structure, the interconnect comprising:
      at least one sidewall coplanar with at least one sidewall of the first conductive structure; and
      at least one other sidewall coplanar with at least one sidewall of the second conductive structure.

9. The microelectronic device of claim 8, wherein the third conductive structure extends colinearly with the first conductive structure and is not collinear with the second conductive structure.

10. The microelectronic device of claim 8, further comprising:
    a third conductive structure at least partially vertically overlapping the second conductive structure;
    another blocking material comprising a dielectric material disposed laterally between the second conductive structure and the third conductive structure, the other blocking material defining at least one other opening through which another interconnect extends; and the other interconnect integral with the third conductive structure and occupying a volume through the other blocking material only in an area in which the third conductive structure overlaps the second conductive structure.

11. The microelectronic device of claim 10, wherein one or more of the first conductive structure or the second conductive structure comprises copper.

12. A method of forming a microelectronic device, the method comprising:
    forming a dielectric material adjacent at least one first feature comprising a first conductive material and a first sacrificial material;
    forming another dielectric material on the first sacrificial material and the dielectric material;
    forming at least one opening through the other dielectric material to expose at least one portion of the first sacrificial material;
    forming a second sacrificial material on the other dielectric material and on the at least one portion of the first sacrificial material exposed by the at least one opening;
    patterning the second sacrificial material to form at least one second feature;
    forming an additional dielectric material adjacent the at least one second feature;
    removing the second sacrificial material and the at least one portion of the first sacrificial material to form an extended opening exposing therein at least one portion of the first conductive material; and
    filling the extended opening with a second conductive material to form at least one interconnect.

13. The method of claim 12, wherein removing the second sacrificial material and the at least one portion of the first sacrificial material comprises:
    removing the at least one portion of the first sacrificial material while leaving at least one other portion of the first sacrificial material adjacent the other dielectric material.

14. The method of claim 12, wherein filling the extended opening with a second conductive material to form at least one interconnect comprises forming the at least one interconnect to a height equal to a height of the first sacrificial material plus a thickness of the other dielectric material.

15. The method of claim 12, wherein filling the extended openings with a second conductive material comprises:
    forming one or more of a barrier material, a seed material, and a nucleation material; and
    forming, in the extended openings, at least one other conductive material on the one or more of the barrier material; the seed material, and the nucleation material.

16. The method of claim 15, wherein filling the extended opening with a second conductive material comprises forming copper within the extended openings.

17. The method of claim 12, further comprising patterning the first conductive material and the first sacrificial material to form an elongate feature directed along a first axis.

18. The method of claim 17, further comprising, before patterning the first conductive material and the first sacrificial material, forming a region of the first conductive material to cover a substrate, the first conductive material being substantially free of copper.

19. The method of claim 17, wherein patterning the second sacrificial material to form at least one second feature comprises forming the at least one second feature comprising another elongate feature directed along a second axis not colinear with the first axis.

20. The method of claim 17, wherein patterning the second sacrificial material to form at least one second feature comprises forming the at least one second feature comprising another elongate feature directed along a second axis colinear with the first axis.

* * * * *

UNITED STATES PATENT AND TRADEMARK OFFICE
CERTIFICATE OF CORRECTION

| | | |
|---|---|---|
| PATENT NO. | : 11,764,146 B2 | Page 1 of 1 |
| APPLICATION NO. | : 17/379257 | |
| DATED | : September 19, 2023 | |
| INVENTOR(S) | : Stephen W. Russell, Fabio Pellizzer and Lorenzo Fratin | |

It is certified that error appears in the above-identified patent and that said Letters Patent is hereby corrected as shown below:

In the Specification

Column 13,   Line 45,   change "width WI, which" to --width $W1$, which--

In the Claims

Claim 15,   Column 22,   Line 15,   change "material; the seed" to --material, the seed--

Signed and Sealed this
Fifth Day of March, 2024

*Katherine Kelly Vidal*

Katherine Kelly Vidal
*Director of the United States Patent and Trademark Office*